United States Patent
Takeuchi et al.

(10) Patent No.: US 10,211,620 B2
(45) Date of Patent: Feb. 19, 2019

(54) SEMICONDUCTOR DEVICE

(71) Applicant: Renesas Electronics Corporation, Tokyo (JP)

(72) Inventors: Kan Takeuchi, Tokyo (JP); Mitsuhiko Igarashi, Tokyo (JP); Makoto Ogasawara, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 377 days.

(21) Appl. No.: 15/216,883

(22) Filed: Jul. 22, 2016

(65) Prior Publication Data

US 2017/0063075 A1 Mar. 2, 2017

(30) Foreign Application Priority Data

Aug. 28, 2015 (JP) .................. 2015-168893

(51) Int. Cl.
| H02H 3/08 | (2006.01) |
| H02H 3/16 | (2006.01) |
| G01R 31/02 | (2006.01) |
| H02H 3/04 | (2006.01) |

(52) U.S. Cl.
CPC ............ *H02H 3/16* (2013.01); *G01R 31/025* (2013.01); *H02H 3/04* (2013.01)

(58) Field of Classification Search
USPC ........................................ 361/93.1
See application file for complete search history.

(56) References Cited

U.S. PATENT DOCUMENTS

2017/0063075 A1* 3/2017 Takeuchi ............... H02H 3/16

FOREIGN PATENT DOCUMENTS

JP    2002-281736 A    9/2002

* cited by examiner

*Primary Examiner* — Ronald W Leja
(74) *Attorney, Agent, or Firm* — Sughrue Mion, PLLC

(57) ABSTRACT

In a semiconductor device, an abnormality monitor unit detects whether abnormal leakage current has been generated from a first functional module or a second functional module on the basis of a comparison between a change in voltage at a first node between the first functional module and a first power switch when the first power switch is in an off state and a change in voltage at a second node between the second functional module and a second power switch when the second power switch is in the off state.

15 Claims, 15 Drawing Sheets

```
                                    COUNTER FOR MD1
| 0 | 0 | 0 | 0 | 0 | 1 | 0 | 0 | X | X | X | X | X | X | X | X | X | X |

| 0 | 0 | 0 | 0 | 0 | 0 | 1 | 1 | X | X | X | X | X | X | X | X | X | X |
                                    COUNTER FOR MD2
```

```
                                    COUNTER FOR MD1
| 0 | 0 | 0 | 0 | 0 | 0 | 1 | X | X | X | X | X | X | X | X | X | X | X |

| 0 | 0 | 0 | 0 | 0 | 0 | 1 | X | X | X | X | X | X | X | X | X | X | X |
                                    COUNTER FOR MD2
```

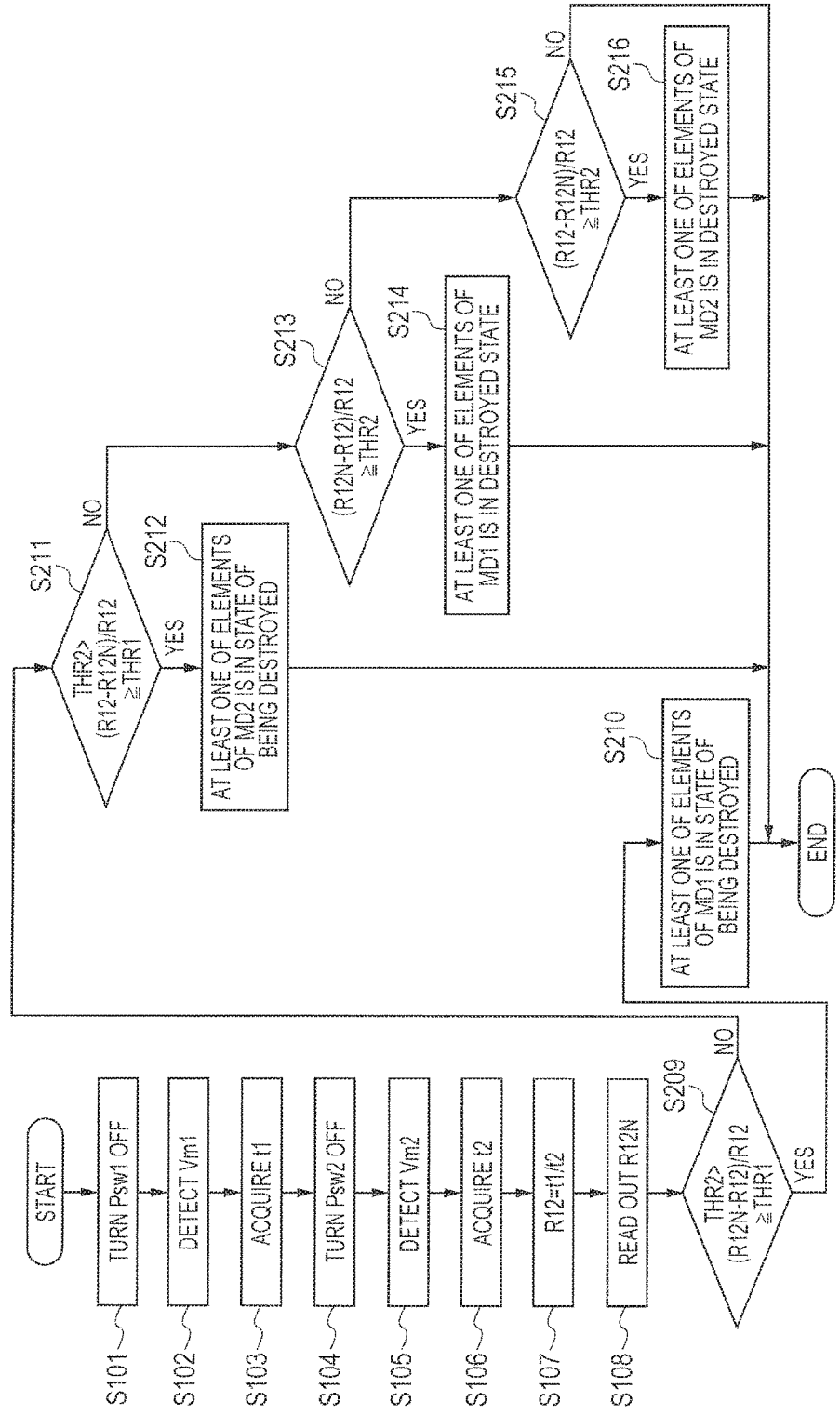

SEMICONDUCTOR DEVICE

CROSS-REFERENCE TO RELATED APPLICATIONS

The disclosure of Japanese Patent Application No. 2015-168893 filed on Aug. 28, 2015 including the specification, drawings and abstract is incorporated herein by reference in its entirety.

BACKGROUND

The present invention relates to a semiconductor device and, in particular, relates to the semiconductor device having, for example, a function of detecting abnormal leakage current.

Generation of the abnormal leakage current between a power supply voltage source and a ground voltage source leads to occurrence of a fault in the semiconductor device and eventually leads to occurrence of stop and malfunction of a system. As causes for generation of the abnormal leakage current, destruction of a gate insulating film, a gate-to-contact short-circuit, destruction of an interlayer film between wirings and so forth may be given.

In Japanese Unexamined Patent Application Publication No. 2002-281736, there is a description that the magnitude of current that has been increased due to the destruction of the gate insulating film is detected from a difference in potential between both ends of a resistance element that is installed on a power current supply path in order to detect the fault in the semiconductor device.

SUMMARY

However, in the technology described in Japanese Unexamined Patent Application Publication No. 2002-281736, it is requested to insert the resistance element into the power current supply path in order to detect the fault in the semiconductor device. Therefore, there is such a disadvantage that in normal operation, a useless voltage drop is induced due to presence of the inserted resistance element and therefore the performance of the semiconductor is degraded.

Other subject matters and novel features of the present invention will become apparent from the description of the present specification and the appended drawings.

According to one embodiment of the present invention, there is provided a semiconductor device that includes an abnormality monitor unit that detects whether abnormal leakage current has been generated from a first functional module or a second functional module on the basis of a comparison between a change in voltage at a first node between the first functional module and a first power switch when the first power switch is in an off state and a change in voltage at a second node between the second functional module and a second power switch when the second power switch is in the off state.

According to the semiconductor device of one embodiment, since it is not requested to install the resistance element on the power current supply path in order to detect the fault in the semiconductor, it is possible to prevent the useless voltage drop from being induced in normal operation.

BRIEF DESCRIPTION OF THE DRAWINGS

FIG. 23 is a flowchart illustrating one example of a procedure of deciding whether the abnormal leakage current has been generated in an eleventh embodiment.

DETAILED DESCRIPTION

Preferred embodiments of the present invention will be described by using the appended drawings.

First Embodiment

Figure 1:
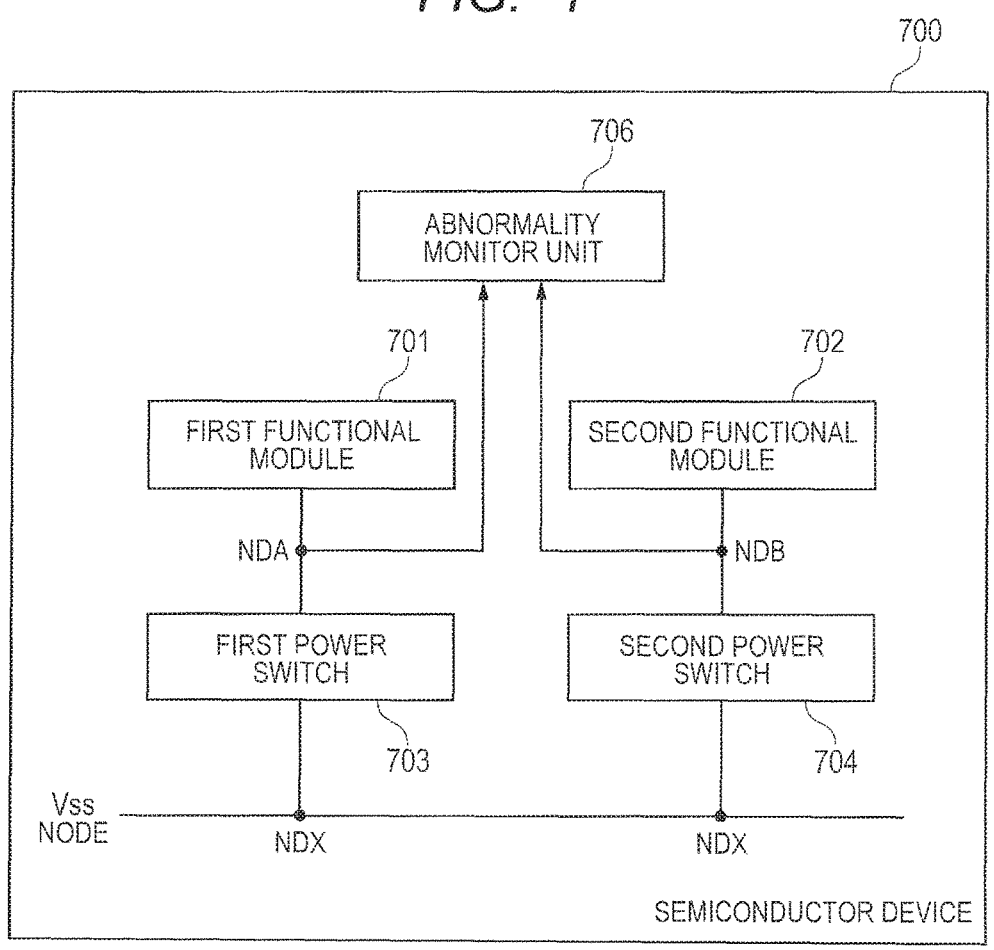
FIG. 1 is a diagram illustrating one example of a configuration of a semiconductor device according to a first embodiment.

FIG. 1 is a diagram illustrating one example of a configuration of a semiconductor device according to the first embodiment.

A semiconductor device 700 includes a first functional module 701, a second functional module 702, a first power switch 703, a second power switch 704, an abnormality monitor unit 706 and so forth.

The first functional module 701 and the second functional module 702 are circuit blocks that are configured so as to respectively execute specific functions. The first functional module 701 and the second functional module 702 each is a CPU (Central Processing Unit) module, a memory module, an image data processing module, a speech data processing module and so forth.

The first power switch 703 controls coupling between the first functional module 701 and a fixed potential node NDX.

The second power switch 704 controls coupling between the second functional module 702 and the fixed potential node NDX.

The abnormality monitor unit 706 detects a change in voltage at a first node NDA between the first functional module 701 and the first power switch 703 when the first power switch 703 is in the off state. The abnormality monitor unit 706 detects a change in voltage at a second node NDB between the second functional module 702 and the second power switch 704 when the second power switch 704 is in the off state.

Then, the abnormality monitor unit 706 detects whether abnormal leakage current is generated from the first functional module 701 or the second functional module 702 on the basis of a comparison between the change in voltage at the first node NDA and the change in voltage at the second node NDB.

As described above, according to the first embodiment, since it is not requested to install the resistance element on the power current supply path in order to detect the fault in the semiconductor device, it is possible to prevent the useless voltage drop from being induced in normal operation.

Second Embodiment

Figure 2:
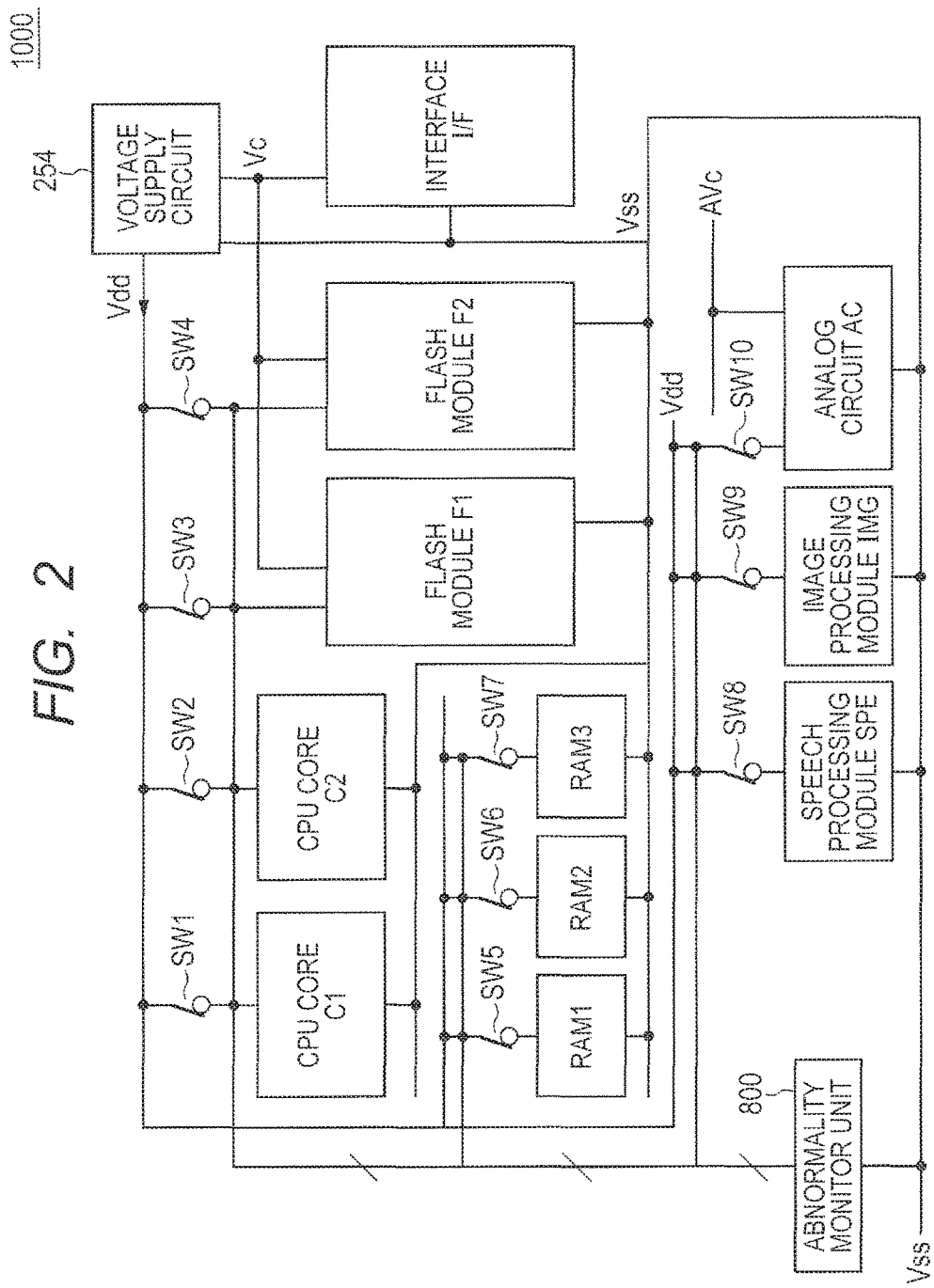
FIG. 2 is a diagram illustrating one example of a configuration of a semiconductor device according to a second embodiment.

FIG. 2 is a diagram illustrating one example of a configuration of a semiconductor device according to the second embodiment.

Description will be made with reference to FIG. 2. A semiconductor device 1000 includes a CPU (Central Processing Unit) core C1, a CPU core C2, a RAM (Random Access Memory) RAM1, a RAM RAM2, a RAM RAM3, a flash module F1, a flash module F2, a voltage supply circuit 254, an interface IF, an image processing module IMG, a speech processing module SPE, an analog circuit AC, power switches SW1 to SW10, an abnormality monitor unit 800 and so forth.

The voltage supply circuit 254 supplies the voltage on the internal power supply voltage source Vdd side to each constitutional element of the semiconductor device 1000. The interface IF performs data transmission to and reception from the outside of the semiconductor device 1000.

The CPU core C1, the CPU core C2, the RAM RAM1, the RAM RAM2 and RAM RAM3, the flash module F1, the flash module F2, the image processing module IMG, the speech processing module SPE, and the analog circuit AC each configures each functional module.

The power switches SW1 to SW10 each is installed between each of the CPU core C1, the CPU core C2, the flash module F1, the flash module F2, the RAM RAM1, the RAM RAM2, the RAM RAM3, the speech processing module SPE, the image processing module IMG and the analog circuit AC and the internal power supply voltage source Vdd. Although in the example in FIG. 1, the power switches are installed on the ground voltage source Vss side, FIG. 2 illustrates a configurational example that the power switches are installed on the internal power supply voltage source Vdd side.

Then, the abnormality monitor unit 800 will be described in detail. Here, for the convenience of description, configurations and operations of monitoring abnormality for two functional modules in the functional modules in FIG. 2 will be described.

Figure 3:
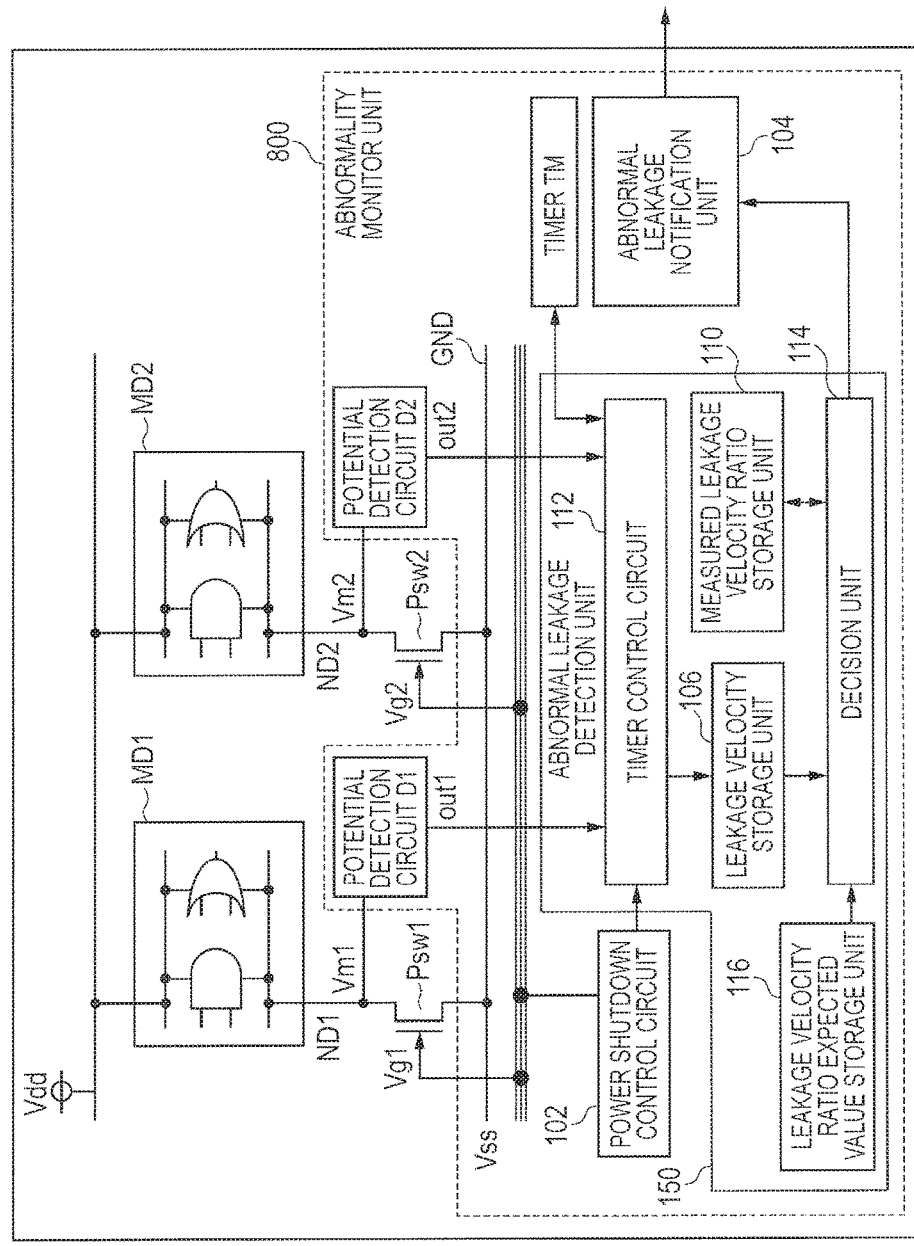
FIG. 3 is a diagram illustrating one example of a configuration of an abnormality monitor unit according to the second embodiment.

FIG. 3 is a diagram illustrating one example of a configuration of the abnormality monitor unit 800 according to the second embodiment.

Description will be made with reference to FIG. 3. The abnormality monitor unit 800 includes potential detection circuits D1 and D2, a timer TM, a power shutdown control circuit 102, an abnormal leakage detection unit 150, an abnormal leakage notification unit 104 and so forth. The abnormal leakage detection circuit 150 includes a timer control circuit 112, a leakage velocity storage unit 106, a leakage velocity ratio expected value storage unit 116, a measured leakage velocity ratio storage unit 110, a decision unit 114 and so forth.

The functional module MD1 and the functional module MD2 each is any one of the plurality of functional modules that ate included in the semiconductor device 1000 illustrated in FIG. 2. The functional module MD1 and the functional module MD2 each includes a plurality of logic circuits that respectively execute specific functions.

Power switches Psw1 and Psw2 each is any one of the power switches SW1 to SW10 included in the semiconductor device 1000 in FIG. 2. However, FIG. 3 illustrates a configurational example that the power switches have been installed not on the internal power supply voltage source Vdd side but on the ground voltage source Vss side similarly to the example in FIG. 1.

The power switch Psw1 is installed between the functional module MD1 and the ground voltage source Vss. The power switch Psw1 is configured by a high threshold voltage NMOS transistor. The power switch Psw1 is in the off state in a time period that the functional module MD1 is not used and thereby it is possible to reduce the amount of useless leakage current that flows from the power supply voltage source Vdd to the ground voltage source Vss via the functional module MD1.

The power switch Psw2 is installed between the functional module MD2 and the ground voltage source Vss. The power switch Psw2 is configured by a high threshold voltage NMOS transistor. The power switch Psw2 is in the off state in a time period that the functional module MD2 is not used and thereby it is possible to reduce the amount of useless leakage current that flows from the power supply voltage source Vdd to the ground voltage source Vss via the functional module MD2.

The potential at the node ND1 between the functional module MD1 and the power switch Psw1 will be referred to as the pseudo ground potential Vm1 and the potential at the node ND2 between the functional module MD2 and the power switch Psw2 will be referred to as the pseudo ground potential Vm2.

It is difficult to reduce the amount of the leakage current to zero even when the power switches Psw1 and Psw2 are in the off states: Since the power switches are configured by the high threshold voltage NMOS transistors, the leakage current that flows from each of the functional modules MD1 and MD2 to the ground voltage source Vss is mostly shut off. On the other hand, the leakage current flows from the power supply voltage source Vdd to each of the functional modules MD1 and MD2 due to presence of subthreshold current, gate current and so forth that are generated from devices such as the NMOS transistors or PMOS transistors that configure the functional modules MD1 and MD2, and so forth. The pseudo ground potentials Vm1 and Vm2 are charged with the leakage current from the power supply voltage source Vdd and become near to the vdd, and consequently the amount of the leakage current that flows from the power supply voltage source Vdd into the functional modules MD1 and MD2 is reduced. In the following, this leakage current will be referred to as normal leakage current. When destruction of a gate insulting film has occurred in any one of devices that configure the functional modules MD1 and MD2 and abnormality has occurred in the functional module MD1 or MD2, the leakage current that is larger than the normal leakage current flows. In the following, this leakage current will be referred as abnormal leakage current. Incidentally, when the power switches are in the on states and the pseudo ground potentials Vm1 and Vm2 are fixed to the potential on the ground voltage source Vss side, the above-mentioned normal leakage current and abnormal leakage current flow from the power supply voltage source Vdd to the ground voltage source Vss as successively flowing current.

In the following, a way of distinguishing the normal leakage current from the abnormal leakage current will be described.

Figure 4A:
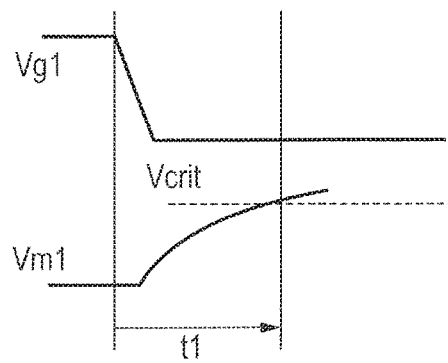
FIG. 4A is a diagram illustrating one example of a change in pseudo ground potential Vm1 when abnormal leakage current flows from a power supply voltage (potential) source Vdd to a functional module MD1.
Figure 4B:
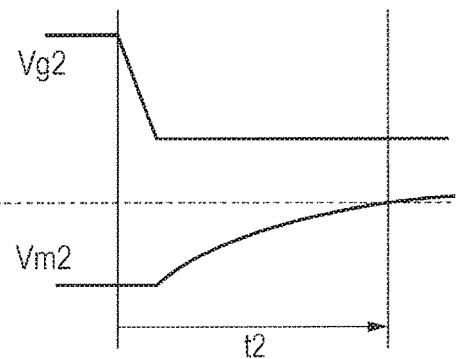
FIG. 4B is a diagram illustrating one example of a change in pseudo ground potential Vm2 when normal leakage current flows from the power supply voltage source Vdd to a functional module MD2.

FIG. 4A is a diagram illustrating one example of a change in the pseudo ground potential Vm1 when the abnormal leakage current flows from the power supply voltage source Vdd to the functional module MD1. FIG. 4B is a diagram illustrating one example of a change in the pseudo ground potential Vm2 when the normal leakage current flows from the power supply voltage source Vdd to the functional module MD2.

In FIG. 4A and FIG. 4B, it is assumed that the number of transistors included in the functional module MD1 is the same as that of the transistors included in the functional module MD2 and threshold voltages of the transistors are equal to one another.

When a gate voltage Vg1 of the power switch Psw1 shifts to a low level, the power switch Psw1 is turned off. As illustrated in FIG. 4A, the pseudo ground potential Vm1 is increased from the voltage on the ground voltage source Vss side up to a threshold voltage Vcrit with the aid of the abnormal leakage current that flows from the power supply voltage source Vdd to the functional module MD1. It is assumed that the threshold voltage Vcrit is defined as, for example, Vdd/2.

Likewise, when a gate voltage Vg2 of the power switch Psw2 shifts to the low level, the power switch Psw2 is turned off. As illustrated in FIG. 4B, the pseudo ground potential Vm2 is raised from the voltage on the ground voltage source Vss side up to the threshold voltage Vcrit with the aid of the normal leakage current that flows from the power supply voltage source Vdd to the functional module MD2.

Since the magnitude of the abnormal leakage current is larger than that of the normal leakage current, a time t1 taken until the pseudo ground potential Vm1 is increased to the threshold voltage Vcrit after the power switch Psw1 has been cut off is short and a time t2 taken until the pseudo ground potential Vm2 is increased to the threshold voltage Vcrit after the power switch Psw2 has been cut off is long.

Therefore, a method may be proposed to judge whether the abnormal leakage current flows from the functional module MD1 or not, depending on whether the time t1 taken until the pseudo ground potential Vm1 is increased to the threshold voltage Vcrit after the power switch Psw1 has been cut off is not more than a predetermined value or not. Likewise, a method may be proposed to judge whether the abnormal leakage current flows from the functional module MD2 or not, depending on whether the time t2 taken until the pseudo ground potential Vm2 is increased to the threshold voltage Vcrit after the power switch Psw2 has been cut off is not more than the predetermined value or not. However, the above-mentioned methods do not go well as described in the following.

Figure 5:
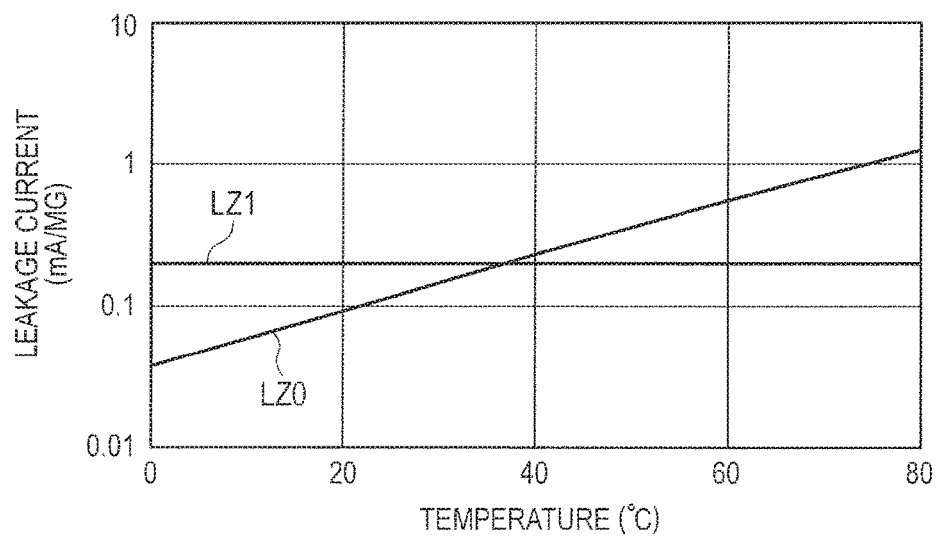
FIG. 5 is a graph illustrating one example of the leakage current.

FIG. 5 is a graph illustrating one example of the leakage current.

In FIG. 5, the magnitude of the leakage current in units of 1M gates (mA/MG) is expressed as a function of a temperature.

When the temperature is increased from about 0° C. to about 80° C. in a state where there is no destroyed part in the gate insulating film, the magnitude of normal leakage current LZ0 is changed by more than one order of magnitude. It is assumed that additional leakage current that has been generated due to destruction of the gate insulating film of any of micro devices, that is, a difference LZ1 between the abnormal leakage current and the normal leakage current is set to, for example, about 0.2 mA. The abnormal leakage current is expressed by LZ0+LZ1. In case of a 1M-gate functional module, the magnitude of the abnormal leakage current at a temperature of, for example, about 20° C. is about 0.3 mA (LZ0=about 0.1 mA/MG, LZ1=about 0.2 mA in local current). On the other hand, the magnitude of the normal leakage current (LZ0) at a temperature of, for example, about 55° C. is about 0.45 mA.

Accordingly, when temperature information is not used, it is difficult to correctly detect whether the abnormal leakage current is generated simply by transition observation of the pseudo ground potential only for one functional module (that is, decision depending on whether a leakage current absolute value is not more than the predetermined value). It is thought that this disadvantage will be eliminated by using the temperature information. However, in this case, there are such disadvantages that it is requested to install a temperature sensor, processing is complicated and so forth.

On the other hand, since it is thought that the temperature is maintained almost at the same value in the semiconductor device, the ratio (hereinafter, referred to as a leakage current ratio) in magnitude of the leakage current between two functional modules is maintained almost at the same value regardless of the temperature.

Figure 6:
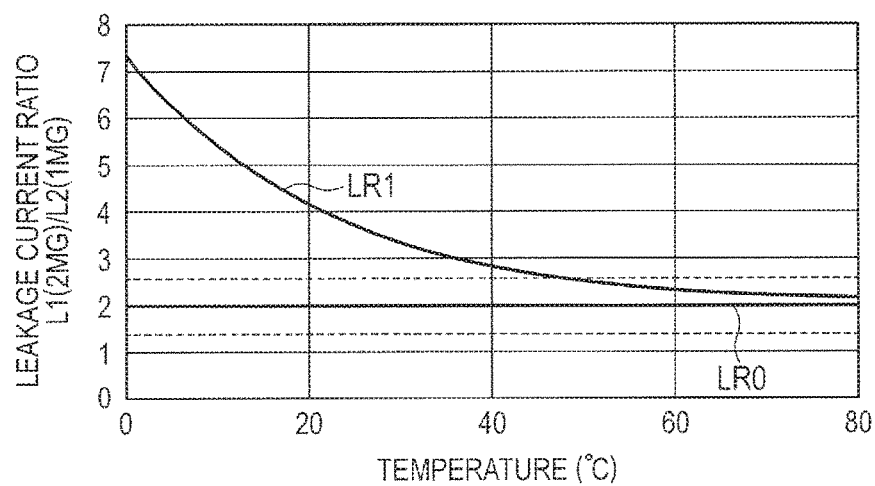
FIG. 6 is a graph illustrating one example of a leakage current ratio.

FIG. 6 is a graph illustrating one example of the leakage current ratio.

For example, when the functional module MD1 is a 2M-gate module and the functional module MD2 is a 1M-gate module, a leakage current ratio LR0 amounts to about 2 regardless of the temperature when there is no destruction of the gate insulating film.

In a state where the abnormal leakage current of about 0.2 mA (which may be low end of the expected value range) has been generated only in the functional module MD1, when the temperature is increased, a leakage current ratio LR1 is decreased. For example, the leakage current ratio LR1 is increased to about 7 at about 0° C. and is decreased to about 3 at about 40° C. When the temperature is increased exceeding about 50° C., the leakage current ratio LR1 approaches the leakage current ratio LR0 attained when there is no destruction of the gate insulating film. However, when the semiconductor device is in a state where its temperature is lower than about 50° C., it becomes possible to decide whether the abnormal leakage current has been generated in the functional module MD1 while allowing an about 30% error of the leakage current ratio. Incidentally, a situation that the leakage current ratio LR1 approaches the leakage current ratio LR0 at a high temperature corresponds to a situation that the magnitude of the normal leakage current becomes sufficiently larger than about 0.2 mA and it becomes difficult to distinguish the abnormal leakage current with additional 0.2 mA from the normal leakage current.

The same also applies to a case where a process condition of one semiconductor device is different from that of another semiconductor device. There are cases where the semiconductor device is processed into a state where the magnitude of the leakage current is larger or smaller than the standard magnitude of the leakage current. However, the leakage current ratio between the functional module MD1 and the functional module MD2 is about 2 when there is no destruction of the gate insulating film irrespective of the process condition of the semiconductor device concerned. Accordingly, even when the process condition of one semiconductor device is different from that of another semiconductor device, it becomes possible to decide whether the abnormal leakage current has been generated in one of the two functional modules while allowing an error of a predetermined amount depending on the leakage current ratio similarly to the case where the temperature is changed.

The leakage current ratio is a ratio between the leakage current of the two functional modules and therefore indicates a ratio in pseudo ground potential changing velocity between the two functional modules.

Accordingly, in the second embodiment, an abnormal leakage detection unit 150 uses the ratio between the time t1 (the time taken until the pseudo ground potential Vm1 is increased to the threshold voltage Vcrit after the power switch Psw1 has been cut off) and the time t2 (the time taken until the pseudo ground potential Vm2 is increased to the threshold voltage Vcrit after the power switch Psw2 has been cut off) that is equivalent in value to the leakage current ratio. Thereby, it is decided whether the abnormal leakage current is generated in one of the functional module MD1 and the functional module MD2.

Description will be made again with reference to FIG. 3. The potential detection circuit D1 detects the pseudo ground potential Vm1 at the node ND1 between the power switch Psw1 and the functional module MD1.

The potential detection circuit D2 detects the pseudo ground potential Vm2 at the node ND2 between the power switch Psw2 and the functional module MD2.

Figure 7:
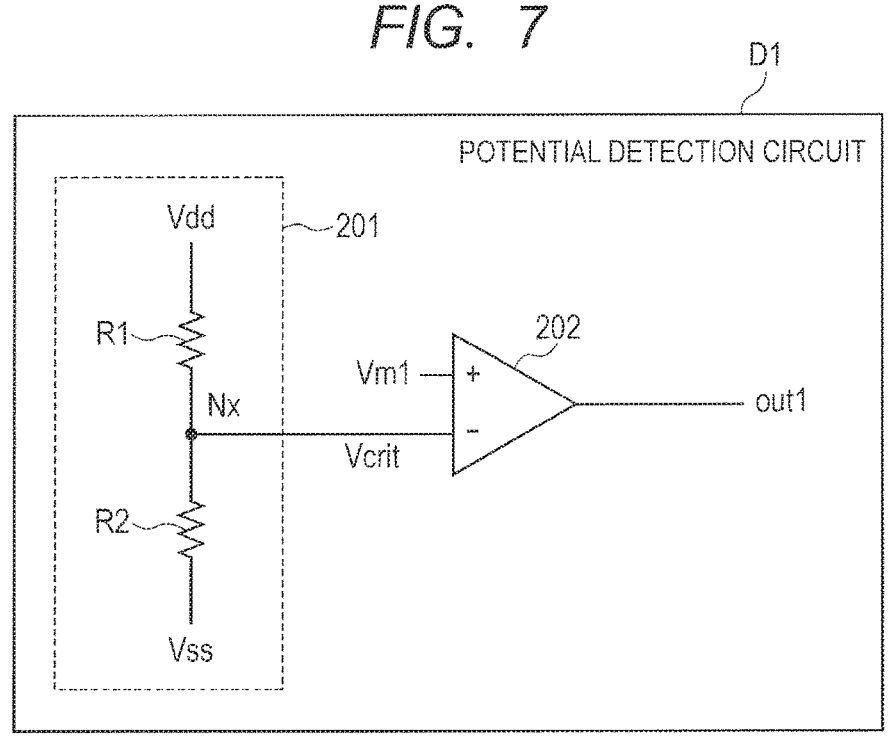
FIG. 7 is a diagram illustrating one example of a configuration of a potential detection circuit.

FIG. 7 is a diagram illustrating one example of a configuration of the potential detection circuit D1. The configuration of the potential detection circuit D2 is the same as that of the potential detection circuit D1.

The potential detection circuit D1 includes a threshold voltage generation circuit 201, a comparator 202 and so forth.

The threshold voltage generation circuit 201 includes a resistor R1 and a resistor R2 that are coupled in series with each other. The resistor R1 is coupled to the power supply voltage source Vdd and the resistor R2 is coupled to the ground voltage source Vss. The threshold voltage Vcrit at the node NX between the resistor R1 and the resistor R2 is sent to the comparator 202. The comparator 202 compares the pseudo ground potential Vm1 with the threshold voltage Vcrit. The comparator 202 outputs an output signal out1 that is at a high level when the pseudo ground potential Vm1 is not less than the threshold voltage Vcrit, and outputs the output signal out1 that is at a low level when the pseudo ground potential Vm1 is less than the threshold voltage Vcrit.

Description will be made again with reference to FIG. 3. The power shutdown control circuit 102 controls on-off operations of the power switches Psw1 and Psw2.

The timer TM measures the time t1 (the time taken until the pseudo ground potential Vm1 is increased up to the threshold voltage Vcrit after the power switch Psw1 has been cut off) and the time t2 (the time taken until the pseudo ground potential Vm2 is increased up to the threshold voltage Vcrit after the power switch Psw2 has been cut off) as leakage velocities.

The timer control circuit 112 controls the timer TM and writes the leakage velocities measured by the timer TM into the leakage velocity storage unit 106.

The leakage velocity ratio expected value storage unit 116 stores an expected value of a leakage velocity ratio. The expected value of the leakage velocity ratio is written into the leakage velocity ratio expected value storage unit 116 before shipment and is a value to be theoretically obtained or a value that has been obtained in a test performed before shipment.

The decision unit 114 calculates a ratio between the two leakage velocities stored in the leakage velocity storage unit 106 and writes the leakage velocity ratio so calculated into the measured leakage velocity ratio storage unit 110. The decision unit 114 decides whether the leakage current has been generated in one of the functional modules MD1 and MD2 on the basis of a result of comparison between the measured leakage velocity ratio that is stored in the measured leakage velocity ratio storage unit 110 and the expected value of the leakage velocity ratio that is stored in the leakage velocity ratio expected value storage unit 116.

When it has been decided by the decision unit 114 that the abnormal leakage current is generated, the abnormal leakage notification unit 104 notifies the generation of the abnormal leakage current to the outside.

Figure 8:
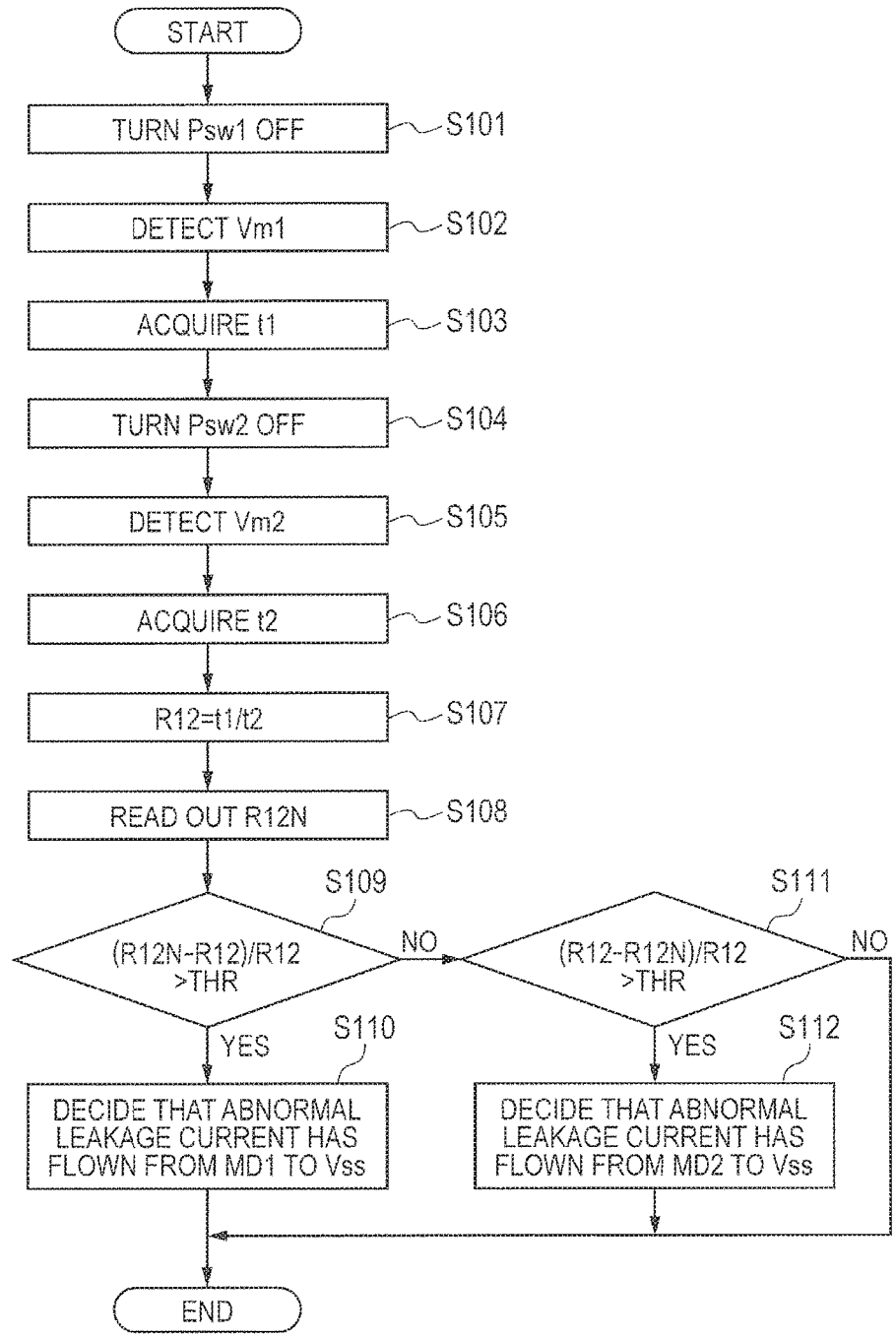
FIG. 8 is a flowchart illustrating one example of a procedure of deciding whether abnormal leakage current has been generated in the second embodiment.

FIG. 8 is a flowchart illustrating one example of a procedure of deciding whether the abnormal leakage current has been generated in the configuration in FIG. 3.

In step S101, when the functional module MD1 is set to be disused, the power shutdown control circuit 102 sets the gate voltage Vg1 of the power switch Psw1 to the low level. Thereby, although the power switch Psw1 is turned off, the leakage current flows from the power supply voltage source Vdd to the functional module MD1 and therefore the pseudo ground potential Vm1 at the node ND1 is slowly increased.

In step S102, the potential detection circuit D1 detects the pseudo ground potential Vm1 and compares the magnitude of the pseudo ground potential Vm1 with that of the threshold voltage Vcrit.

In step S103, the timer control circuit 112 has made the timer TM start at a timing that the gate voltage Vg1 of the power switch Psw1 has been set to the low level. The timer control circuit 112 receives the output signal out1 that is set to the high level when the pseudo ground potential Vm1 is detected to increase up to the threshold voltage Vcrit by the potential detection circuit D1 and then makes the timer TM stop. The timer control circuit 112 acquires the time t1 taken until the pseudo ground potential Vm1 is increased from the ground voltage source Vss side voltage up to the threshold voltage Vcrit from the timer TM and writes the time t1 into the leakage velocity storage unit 106. It is assumed that the threshold voltage Vcrit is defined as, for example, Vdd/2.

In step S104, when the functional module MD2 is set to be disused, the power shutdown control circuit 102 sets a gate voltage Vg2 of the power switch Psw2 to the low level. Thereby, since the leakage current flows from the power supply voltage source Vdd to the functional module MD2, the pseudo ground potential Vm2 at the node ND2 is slowly increased.

In step S105, the potential detection circuit D2 detects the pseudo ground potential Vm2 and compares the magnitude of the pseudo ground potential Vm2 with that of the threshold voltage Vcrit.

In step S106, the timer control circuit 112 has made the timer TM start at a timing that the gate voltage Vg2 of the power switch Psw2 has been set to the low level. The timer control circuit 112 receives an output signal out2 that is set to the high level when the pseudo ground potential Vm2 that is detected to increase up to the threshold voltage Vcrit by the potential detection circuit D2 and then makes the timer TM stop. The timer control circuit 112 acquires the time t2 taken until the pseudo ground potential Vm2 is increased from the ground voltage source Vss side voltage up to the threshold voltage Vcrit from the timer TM and writes the acquired time t2 into the leakage velocity storage unit 106.

In step S107, the decision unit 114 calculates a ratio R12 (=t1/t2) between the times t1 and t2 and writes the calculated ratio R12 into the measured leakage velocity ratio storage unit 110.

In step S108, the decision unit 114 reads an expected value R12N of the leakage velocity ratio (t1/t2) out of the leakage velocity ratio expected value storage unit 116. The expected value R12N of the leakage velocity ratio (t1/t2) is written into the leakage velocity ratio expected value storage unit 116 before shipment and is a value that is theoretically obtained or a value that has been obtained in a test performed before shipment.

In step S109, when (R12N−R12)/R12>THR (S109: YES), the process proceeds to step S110, and when (R12N−R12)/R12≤THR (S109: NO), the process proceeds to step S111. THR may be set to, for example, about "0.3".

In step S110, the decision unit 114 decides that the abnormal leakage current has flown from the power supply voltage source Vdd to the functional module MD1.

In step S111, when (R12−R12N)/R12>THR (S111: YES), the process proceeds to step S112.

In step S112, the decision unit 114 decides that the abnormal leakage current has flown from the power supply voltage source Vdd to the functional module MD2.

As described above, according to the second embodiment, it is possible to promptly detect the fault in the semiconductor device concerned in the market and to cope with the fault before the fault leads to a serious system failure by mutually comparing the velocities at which the pseudo ground potentials Vm1 and Vm2 change by the potential detection circuits D1 and D2, the timer TM, the abnormal leakage detection unit 103 and so forth. Incidentally, although in the example in FIG. 8, S101 to S103 and S104 to S106 are serially processed in time series, it goes without saying that these steps may be processed in parallel.

In the second embodiment, since the abnormality is decided on the basis of the ratio between the time t1 of the functional module MD1 and the time t2 of the functional module MD2, it is possible to stably detect the abnormal leakage current regardless of the process condition and an environmental temperature of the semiconductor device concerned.

Third Embodiment

Although the power switches may be arranged either on the ground voltage source Vss side (FIG. 1 and FIG. 3) or on the power supply voltage source Vdd side (FIG. 2), the details have been described with a focus on one example that the power switches have been arranged on the ground voltage source Vss side in the second embodiment. In the third embodiment, in the configuration that is illustrated in FIG. 2 and has been arranged on the power supply voltage source Vdd side, the voltage supply circuit 254, and the power switch (SW1 and so forth) are merged.

Figure 9:
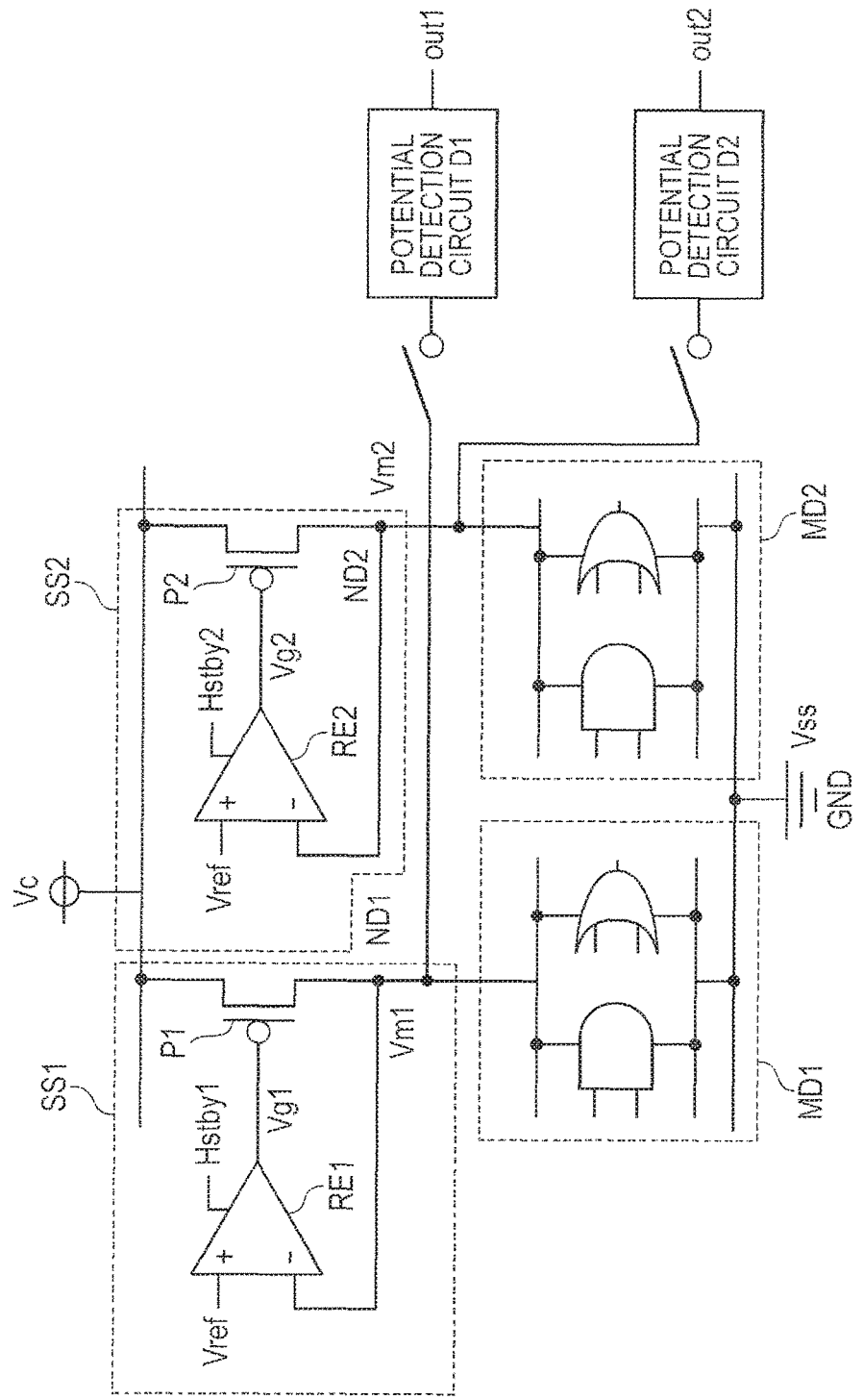
FIG. 9 is a diagram illustrating one example of power switches SS1 and SS2 according to a third embodiment.

FIG. 9 is a diagram illustrating one example of the power switches SS1 and SS2 according to the third embodiment.

The power switch SS1 configured by merging the voltage supply circuit and the power switch includes a differential amplifier RE1, a PMOS transistor P1 that includes a gate to be coupled to an output terminal of the differential amplifier RE1 and so forth. The power switch SS2 configured by merging the voltage supply circuit and the power switch includes a differential amplifier RE2, a PMOS transistor P2 that includes a gate to be coupled to an output terminal of the differential amplifier RE2 and so forth.

The PMOS transistor P1 is installed between an external power source Vc and the functional module MD1. The PMOS transistor P2 is installed between the external power source Vc and the functional module MD2. When a control signal Hstby1 shifts to the low level, the differential amplifier RE1 shifts to an operating state. When the pseudo (power supply voltage) potential Vm1 is made lower than a reference potential Vref due to power consumption of the functional module MD1, the PMOS transistor P1 is turned on and the pseudo potential Vm1 is pulled up by the external power source Vc. Then, when the pseudo potential Vm1 returns to a potential that is almost equal to the reference potential Vref, the PMOS transistor P1 is turned off. The reference potential Vref is equal to the potential of the internal power supply voltage source Vdd and the pseudo potential Vm1 is maintained at the potential of the internal power supply voltage source Vdd. The power switch SS1 functions as the voltage supply circuit in this way.

When the control signal Hstby1 shifts to the high level, the gate voltage Vg1 that is output from the differential amplifier RE1 shifts to the high level. When the gate voltage Vg1 shifts to the high level, the PMOS transistor P1 is turned off. The PMOS transistor P1 is at a high threshold voltage and the leakage current is shut off. However, since the leakage current flows from the functional module MD1 to the ground voltage source Vss, the pseudo potential Vm1 at the node ND1 is decreased from the potential of the power supply voltage source Vdd down to Vcrit.

Figures 10A, 10B:
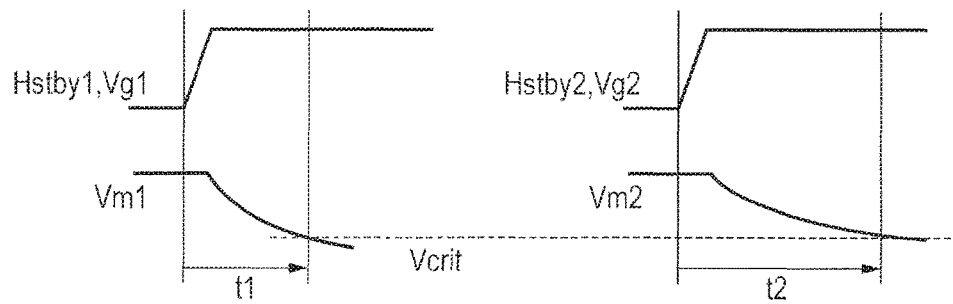
FIG. 10A is a diagram illustrating one example of a change in the pseudo (power supply voltage) potential Vm1 at a node ND1 when the abnormal leakage current flows from the functional module MD1 to a ground voltage (potential) source Vss.
FIG. 10B is a diagram illustrating one example of a change in the pseudo (power supply voltage) potential Vm2 at a node ND2 when normal leakage current flows from the functional module MD2 to the ground power source Vss.

FIG. 10A is a diagram illustrating one example of a change in the pseudo potential Vm1 at the node ND1 when the abnormal leakage current flows from the functional module MD1 to the ground voltage source Vss. FIG. 10B is a diagram illustrating one example of a change in the pseudo potential Vm2 at the node ND2 when a control signal Hstby2 shifts to the high level and the normal leakage current flows from the functional module MD2 to the ground voltage source Vss.

In the examples in FIG. 10A and FIG. 10B, it is assumed that the number of transistors included in the functional module MD1 is the same as the number of transistors included in the functional module MD2 and the threshold voltages of the transistors are equal to one another.

Since the magnitude of the abnormal leakage current is larger than that of the normal leakage current, the time t1 taken until the pseudo potential Vm1 is decreased down to Vcrit after the power switch SS1 has been cut off is short and the time t2 taken until the pseudo potential Vm2 is deceased down to Vcrit after the power switch SS2 has been cut off is long.

In the third embodiment, in order to cope with the influence of temperature-dependent increase and decrease in leakage current, the abnormal leakage detection unit 150 uses the ratio between the time t1 (the time taken until the pseudo potential Vm1 is decreased down to Vcrit after the power switch Psw1 is cut off) and the time t2 (the time taken until the pseudo potential Vm2 is deceased down to Vcrit after the power switch Psw2 has been cut off). Thereby, it is decided whether the abnormal leakage current is generated in one of the functional module MD1 and the functional module MD2 on the basis of the ratio between the times t1 and t2.

Since detailed configuration and operation of the abnormal leakage detection unit 150 are the same as those of the abnormal leakage detection unit 150 according to the second embodiment excepting such a difference that the times t1 and t2 are times taken until the pseudo potentials Vm1 and Vm2 are increased up to or decreased down to Vcrit, description thereon is not repeated.

As described above, according to the third embodiment, the same advantageous effects as those of the second embodiment are obtained.

Fourth Embodiment

Figure 11:
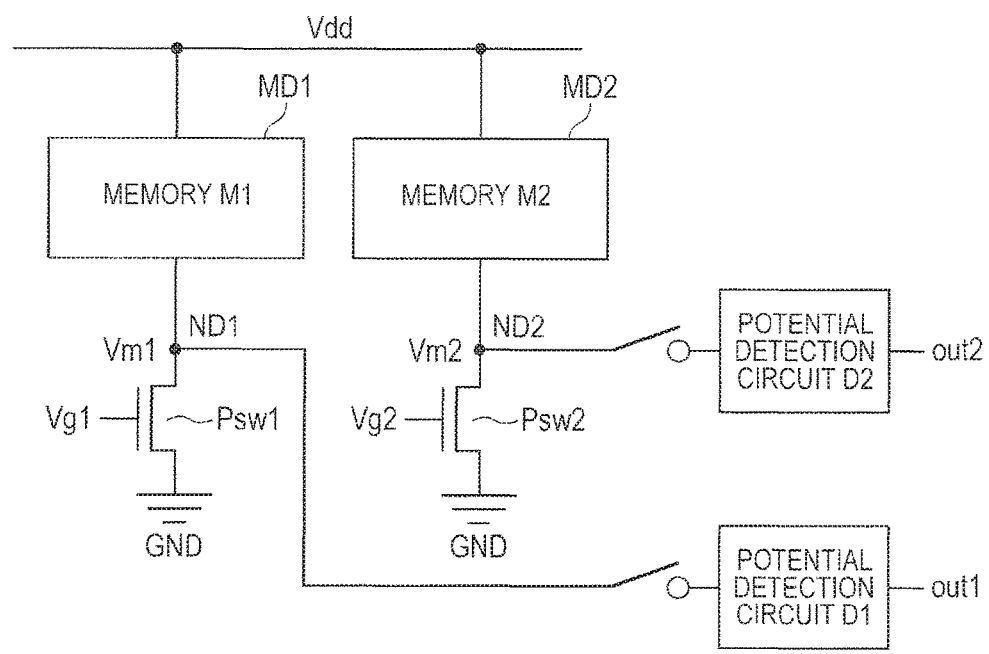
FIG. 11 is a diagram illustrating one example of the functional modules MD1 and MD2 according to a fourth embodiment.

FIG. 11 is a diagram illustrating one example of configurations of the functional modules MD1 and MD2 according to the fourth embodiment.

The functional module MD1 according to the fourth embodiment is configured by a memory M1 in place of the logic circuit group according to the second embodiment. The functional module MD2 according to the fourth embodiment is configured by a memory M2 in place of the logic circuit group according to the second embodiment.

The memories M1 and M2 are, for example, SRAMs (Static Random Access Memories), DRAMs (Dynamic Random Access Memories), flash memories and so forth.

The potential detection circuits D1 and D2, the abnormal leakage detection unit 150 and so forth detect generation of the abnormal leakage currents that flow from the power supply voltage source Vdd respectively to the memories M1 or M2.

As described above, according to the fourth embodiment, the same advantageous effects as those of the second and third embodiments are obtained.

Fifth Embodiment

Figure 12:
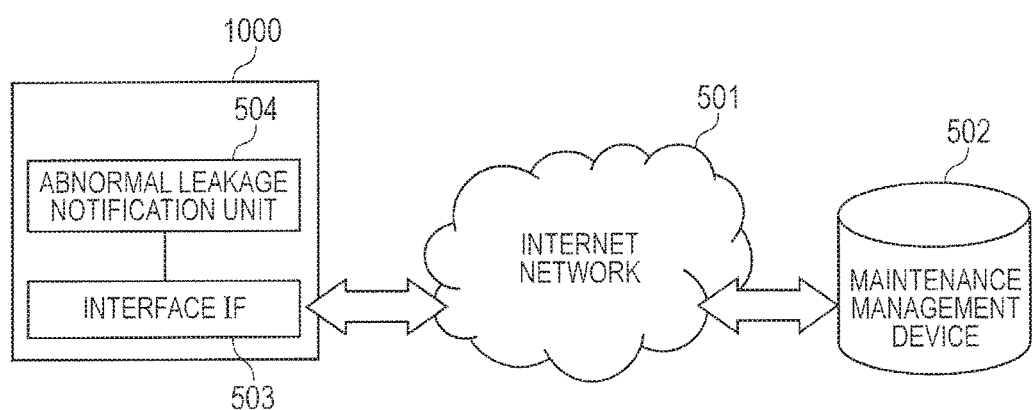
FIG. 12 is a diagram illustrating one example of an abnormal leakage notification unit 504 according to a fifth embodiment.

FIG. 12 is a diagram illustrating one example of the abnormal leakage notification unit 504 according to the fifth embodiment.

The abnormal leakage notification unit 504 according to the fifth embodiment is coupled with the interface IF. The interface IF is coupled to a maintenance management device 502 via an Internet network 501. Thereby, when the abnormal leakage current has been generated, it is possible for the abnormal leakage notification unit 504 to notify the maintenance management device 502 of generation of the abnormal leakage current. It is possible for a maintenance worker who has known that generation of the abnormal leakage current has been notified to the maintenance management device 502 to take measures such as replacement of the whole semiconductor device concerned with a new semiconductor device, replacement of the logic circuit that the fault has occurred with a new logic circuit and so forth.

Sixth Embodiment

Figure 13:
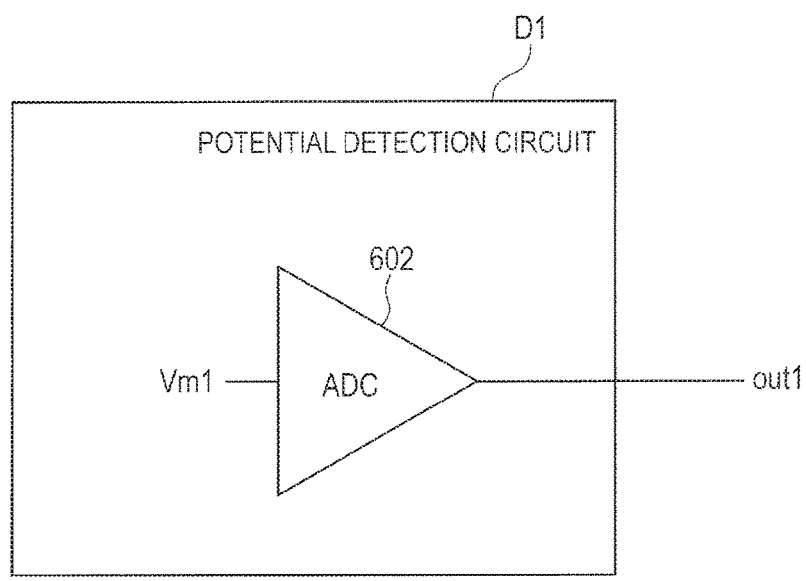
FIG. 13 is a diagram illustrating one example of a configuration of a potential detection circuit according to a sixth embodiment.

FIG. 13 is a diagram illustrating one example of the configuration of the potential detection circuit D1 according to the sixth embodiment. The configuration of the potential detection circuit D2 is also the same as the above.

The potential detection circuit D1 includes an ADC (Analog to Digital Converter) 602 and so forth.

The ADC 602 outputs the output signal out1 having a digital value "1" when the pseudo ground potential Vm1 is not less than the threshold voltage Vcrit and outputs the output signal out1 having a digital value "0" when the pseudo ground potential Vm1 is less than the threshold voltage Vcrit.

Seventh Embodiment

Figure 14:
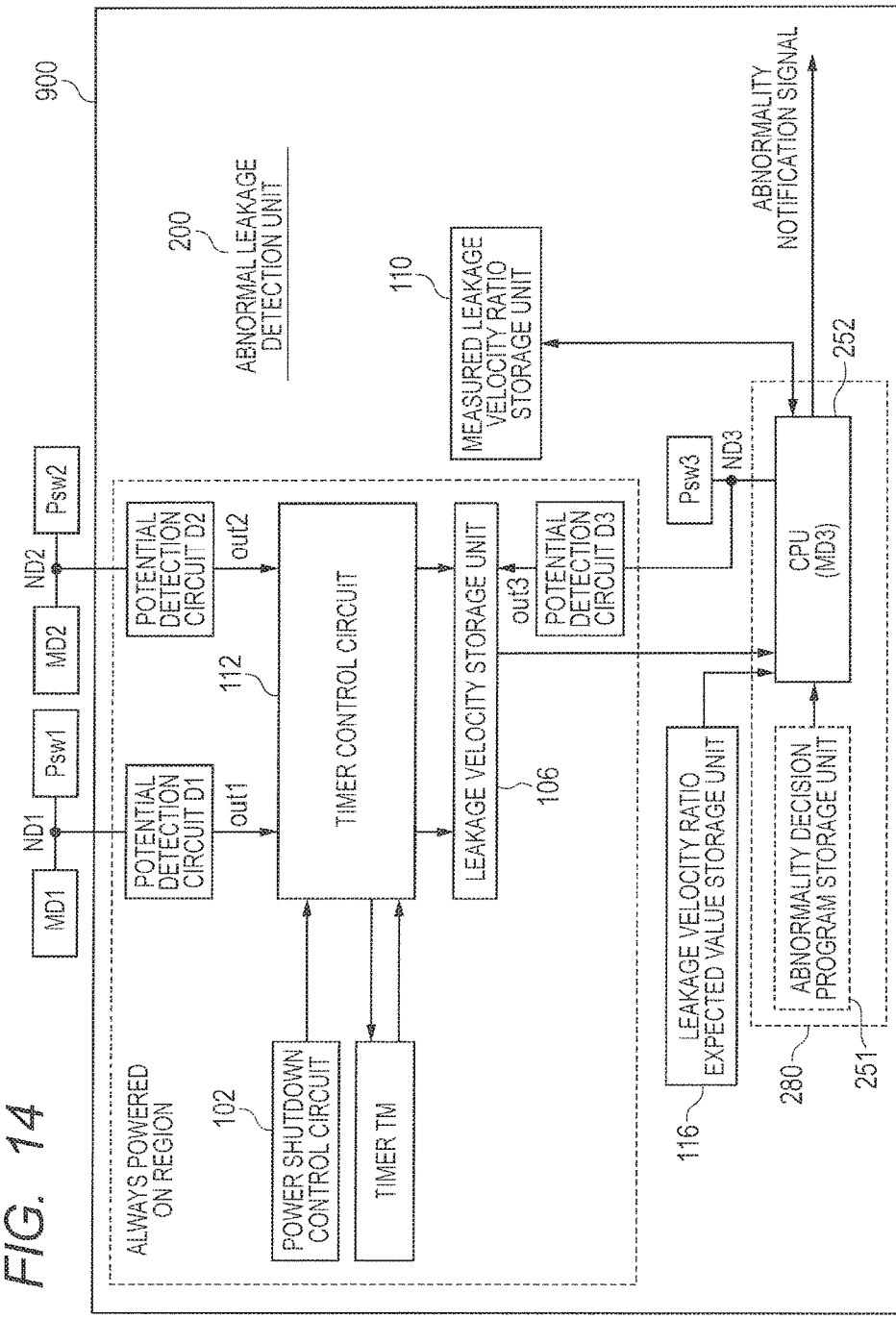
FIG. 14 is a diagram illustrating one example of arrangement of constitutional elements in an abnormality monitor unit according to a seventh embodiment.

FIG. 14 is a diagram illustrating one example of arrangement of constitutional elements in an abnormality monitor unit 900 according to the seventh embodiment.

An abnormal leakage detection unit 200 includes the timer control circuit 112, the leakage velocity storage unit 106, the leakage velocity ratio expected value storage unit 116, the measured leakage velocity ratio storage unit 110 and so forth similarly to the abnormal leakage detection unit 150 according to the second embodiment. The abnormal leakage detection unit 200 also includes a decision unit 280 that includes an abnormality decision program storage unit 251, a CPU 252 and so forth.

The CPU 252 configures a functional module MD3. The CPU 252 executes an abnormality decision program and thereby the function of the decision unit that has been described in the second embodiment is implemented.

A power switch Psw3 is installed between the CPU 252 and the ground voltage source Vss. The power switch Psw3 is configured by a high threshold voltage NMOS transistor. The power switch Psw3 is in the off state in a time period that the CPU 252 is not used and therefore it is possible to reduce the amount of the useless leakage current that flows from the power supply voltage source Vdd to the ground voltage source Vss through the CPU 252.

A potential detection circuit D3 activates an output signal out3 to the high level at a timing that a pseudo ground potential Vm3 at a node ND3 between the CPU 252 and the power switch Psw3 has been increased to the threshold voltage Vcrit.

The power shutdown control circuit 102 controls the power switch Psw3 in addition to control of the power switches Psw1 and Psw2.

The timer control circuit 112 controls the timer TM in order to acquire a time t3 taken until the pseudo ground potential Vm3 is increased from the ground voltage source Vss side voltage up to the threshold voltage Vcrit in addition to acquisition of the time t1 and the time t2. The timer control circuit 112 makes the timer TM start at a timing that a gate voltage Vg3 of the power switch Psw3 has been set to the low level. The timer control circuit 112 receives the output signal out3 that is set to the high level when the pseudo ground potential Vm3 that is detected to increase up to the threshold voltage Vcrit by the potential detection circuit and then makes the timer TM stop. The timer control circuit 112 acquires the time t3 taken until the pseudo ground potential Vm3 is increased from the ground voltage source Vss side voltage up to the threshold voltage Vcrit from the timer TM and writes the acquired time t3 into the leakage velocity storage unit 106.

It is possible for the decision unit 280 to calculate the ratio R12 (=t1/t2) on the basis of the times t1 and t2 and to write the calculated ratio R12 into the measured leakage velocity ratio storage unit 110. In addition, it is possible for the decision unit 280 to calculate a ratio R13 (=t1/t3) on the basis of the times t1 and t3 and to write the calculated ratio R13 into the measured leakage current ratio storage unit 110. In addition, it is possible for the decision unit 280 to calculate a ratio R23 (=t2/t3) on the basis of the times t2 and t3 and to write the calculated ratio R23 into the measured leakage velocity ratio storage unit 110.

The leakage velocity ratio expected value storage unit 116 stores expected values R12N, R13N and R23N of the leakage velocity ratios. R12N is the expected value of the ratio between t1 and t2, R13N is the expected value of the ratio between t1 and t3 and R23N is the expected value of the ratio between t2 and t3.

It is possible for the decision unit 280 to decide whether the abnormal leakage current has flown from the power supply voltage source Vdd to one of the functional module MD1 and the functional module MD2 on the basis of the ratio R12 and the ratio expected value R12N similarly to the decision unit 114 according to the second embodiment. In addition, it is also possible for the decision unit 280 to decide whether the abnormal leakage current has flown from the power supply voltage source Vdd to one of the functional module MD1 and the functional module MD3 on the basis of the ratio R13 and the ratio expected value R13N. In addition, it is also possible for the decision unit 280 to decide whether the abnormal leakage current has flown from one of the functional module MD2 and the functional module MD3 to the ground voltage source Vss on the basis of the ratio R23 and the ratio expected value R23N.

The timer control circuit 112 and the leakage velocity storage unit 106 included in the abnormal leakage detection unit 200 are arranged in a always powered-on region.

Further, the potential detection circuits D1 to D3, the power shutdown control circuit 102 and the timer TM are also arranged in the always powered-on region.

Since the timer control circuit 112, the leakage velocity storage unit 106, the potential detection circuits D1 to D3, the power shutdown control circuit 102, the timer TM and so forth are arranged in the always powered-on region, it is possible to typically execute measurement of the times t1, t2 and t3.

The functional modules MD1 and MD2, the leakage velocity ratio expected value storage unit 116, the measured leakage velocity ratio storage unit 110, the abnormality decision program storage unit 251, the CPU 252 and so forth are arranged in a region that supply of the power supply voltage is shut off as requested. However, the leakage velocity ratio expected value storage unit 116 and the abnormality decision program storage unit 251 are included in a nonvolatile memory that memory is not vanished even when supply of the power supply voltage is shut off.

Accordingly, although a decision as to whether the abnormal leakage current is present is executed only in a time period that the current is supplied into the above-mentioned regions, it is not requested to decide whether the abnormal leakage current is present in real time and therefore no disadvantage is caused.

Altered Example 1 of Seventh Embodiment

The leakage velocity storage unit 106 may be included in the nonvolatile memory that memory is not vanished even when supply of the power supply voltage is shut off.

Altered Example 2 of Seventh Embodiment

When a fault has occurred in the CPU 252, there is a possibility that even when the abnormal leakage current flows out of the CPU 251, it may be difficult to accurately detect the abnormal leakage current because the fault has occurred in the CPU 252 and therefore it may be difficult to find the fault in the CPU 252. However, in a case where the semiconductor device includes two CPUs and the two CPUs execute a dual lock step of mutually monitoring mutual operations, when a result of decision made by one CPU is different from a result of decision made by another CPU, it is possible to detect that there is a fault in one of the CPUs. Otherwise, it is possible to decide that abnormality has occurred in the decision unit 200 that includes the CPU 252 from abnormal results of the calculations of all of the ratios t1/t2, t2/t3 and t1/t3.

Eighth Embodiment

Figure 15:
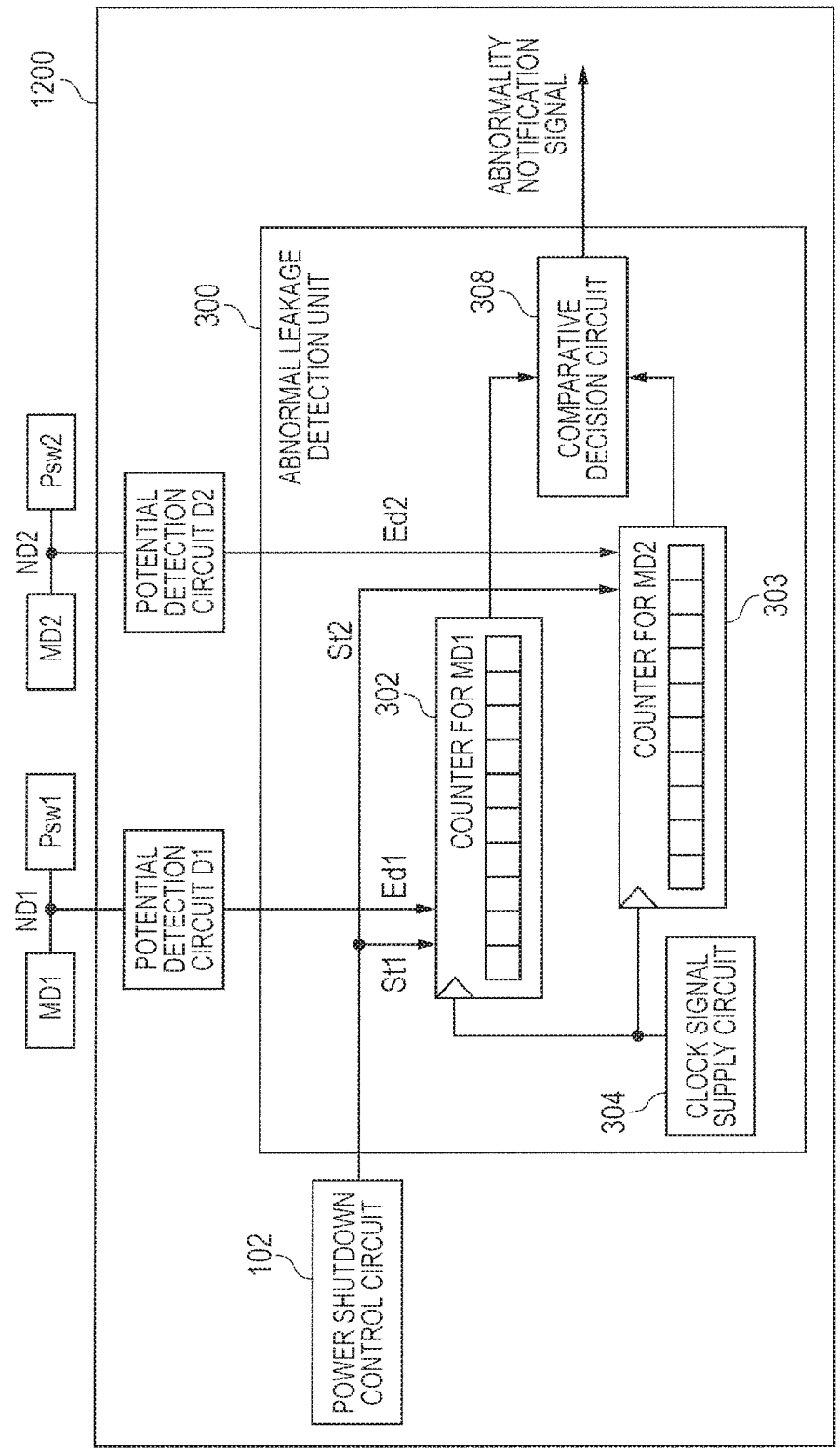
FIG. 15 is a diagram illustrating one example of a configuration of an abnormality monitor unit according to an eighth embodiment.

FIG. 15 is a diagram illustrating one example of a configuration of an abnormality monitor unit 1200 according to the eighth embodiment.

The abnormality monitor unit 1200 includes the potential detection circuits D1 and D2, the power shutdown control circuit 102, an abnormal leakage detection unit 300 and so forth. The abnormal leakage detection unit 300 includes a counter 302 for the functional modules MD1, a counter 303 for the functional module MD2, a clock signal supply circuit 304, a comparative decision circuit 308 and so forth.

The clock signal supply circuit 304 outputs a clock signal CLK of a fixed cycle.

The power shutdown control circuit 102 activates a start signal St1 to the high level at a timing that the gate voltage Vg1 of the power switch Psw1 has been set to the low level.

The power shutdown control circuit 102 activates a start signal St2 to the high level at a timing that the gate voltage Vg2 of the power switch Psw2 has been set to the low level.

The potential detection circuit D1 activates an end signal Ed1 to the high level at a timing that the pseudo ground potential Vm1 has been increased up to the threshold voltage Vcrit. The potential detection circuit D2 activates an end signal Ed2 to the high level at a timing that the pseudo ground potential Vm2 has been increased up to the threshold voltage Vcrit.

The counter 302 for the functional module MD1 and the counter 303 for the functional module MD2 303 counts the number of pulses of the clock signal CLK received by incrementing a counted value at a rising timing of the clock signal CLK.

The counter 302 for the functional module MD1 starts counting at a timing that the start signal St1 has been activated to the high level and terminates counting at a timing that the end signal Ed1 has been activated to the high level. The counter 303 for the functional module MD2 starts counting at a timing that the start signal St2 has been activated to the high level and terminates counting at a timing that the end signal Ed2 has been activated to the high level.

After counting has been terminated, the counter 302 for the functional module MD1 stores the counted value t1 (the time taken until the pseudo ground potential Vm1 is increased up to the threshold voltage Vcrit after the power switch Psw1 has been cut off). After counting has been terminated, the counter 303 for the functional module MD2 stores the counted value t2 (the time taken until the pseudo ground potential Vm2 is increased up to the threshold voltage Vcrit after the power switch Psw2 has been cut off).

When there is a difference that exceeds a predetermined allowable error range between the counted value (t1) stored in the counter 302 for the functional module MD1 and the counted value (t2) stored in the counter 303 for the functional module MD2, the comparative decision circuit outputs an abnormality notification signal.

It is assumed that the number of transistors included in the functional module MD1 is the same as that of transistors included in the functional module MD2 and the threshold voltages of the transistors are equal to one another.

Here, when $0.5 \leq R12 \leq 2$, it is assumed to decide that the abnormal leakage current does not flow from both of the functional module MD1 and the functional module MD2. In order to implement such a decision, when the situation corresponds to the following two cases, it is assumed that the comparative decision circuit 308 decides that the abnormal leakage current does not flow from both of the functional module MD1 and the functional module MD2.

Figures 16, 17, 18:
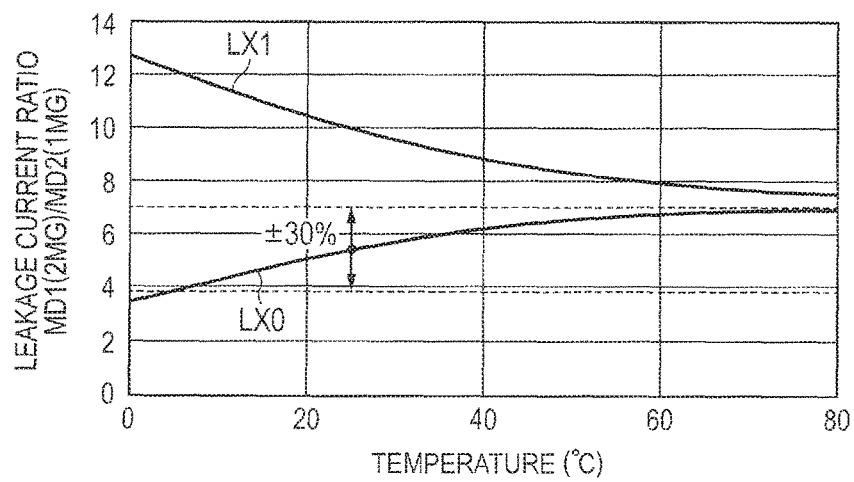
FIG. 16 is a diagram illustrating one example of a counted value that is stored in a counter for the functional module MD1 and a counted value that is stored in a counter for the functional module MD2.
FIG. 17 is a diagram illustrating another example of the counted value that is stored in the counter for the functional module MD1 and the counted value that is stored in the counter for the functional module MD2.
FIG. 18 is a graph illustrating one example of a leakage current ratio between the functional module MD1 and the functional module MD2 when the functional modules MD1 and MD2 satisfy a condition A.

FIG. 16 is a diagram illustrating one example of the counted value that is stored in the counter 302 for the functional module MD1 and the counted value that is stored in the counter 303 for the functional module MD2.

FIG. 17 is a diagram illustrating another example of the counted value that is stored in the counter 302 for the functional module MD1 and the counted value that is stored in the counter 303 for the functional module MD2.

(1) As illustrated in FIG. 16, one of the counted value that is stored in the counter 302 for the functional module MD1 and the counted value that is stored in the counter 303 for the functional module MD2 is larger than the other by one digit (the number of bits is larger by one), the counted value that is larger in digit is "100X . . . " b and the counted value that is smaller in digit is "011X . . . " b. Incidentally, X indicates "0" or "1" and b indicates a binary numeral.

(2) As illustrated in FIG. 17, the counted value that is stored in the counter 302 for the functional module MD1 and the counted value that is stored in the counter 303 for the functional module MD2 are equal to each other in digit (the number of bits).

As described above, according to the eighth embodiment, since the configuration of the abnormal leakage detection unit is simplified, it is possible to reduce an area of the abnormal leakage detection unit 300.

Incidentally, it is possible to generate the abnormality notification signal immediately after detection of the abnormal leakage current by installing all of the constitutional elements of the abnormal leakage detection unit 300 in FIG. 15 in the always powered-on region.

Ninth Embodiment

It is assumed that the semiconductor device according to the ninth embodiment includes a transistor (hereinafter, designated by SVT) having a standard threshold voltage, a transistor (hereinafter, designated by HVT) having a high threshold voltage and a transistor (hereinafter, designated by LVT) having a low threshold voltage.

It is assumed that the functional modules MD1 and MD2 satisfy the following condition A. It is assumed that the number of gates included in the functional module MD1 is 2M gates. It is assumed that the transistors included in the functional module MD1 are the transistors SVT. It is assumed that the number of gates included in the functional module MD2 is 1M gates. It is assumed that 80% of the transistors included in the functional module MD2 are the transistors HVT. 20% of the transistors included in the functional module MD2 are the transistors SVT.

FIG. 18 is a graph illustrating one example of a leakage current ratio between the functional module MD1 and the functional module MD2 when the functional modules MD1 and MD2 satisfy the condition A.

A leakage current ratio LX0 obtained in a state where there is no destruction of the gate insulating film and a leakage current ratio LX1 obtained in a state where the destruction of the gate insulting film has been generated in the functional module MD1 have temperature dependency unlike the leakage current ratio between the functional modules that are configured by the transistors that are mutually the same in threshold voltage as illustrated in FIG. 4. This is because the temperature dependency of the leakage current of the transistor HVT is different from the temperature dependency of the leakage current of the transistor SVT.

For example, when a decision is made with the current ratio obtained at about 25° C. being set as the expected value and allowing an error of about 30%, it is not erroneously decided that the abnormal leakage current has been generated at a temperature between about 5° C. and about 80° C. In addition, when the abnormal leakage current of about 0.2 mA has been generated, this value is out of the allowable error range of about 30% and therefore the abnormal leakage current is detected.

However, when the accuracy and noises of the potential detection circuit are taken into account, it is desirable for the leakage current ratio not to exhibit the temperature dependency to the greatest possible extent in a state where the abnormal leakage current is not generated. When the ratios among the transistors HVT, SVT and LVT included in the two functional modules are same as each other, the leakage current ratio between the above-mentioned functional modules does not exhibit the temperature dependency.

Accordingly, in the ninth embodiment, two functional modules that are the same as or similar to each other in the ratio among the transistors HVT, SVT and LVT are selected and the leakage current ratio between the selected functional modules is obtained.

Figure 19:
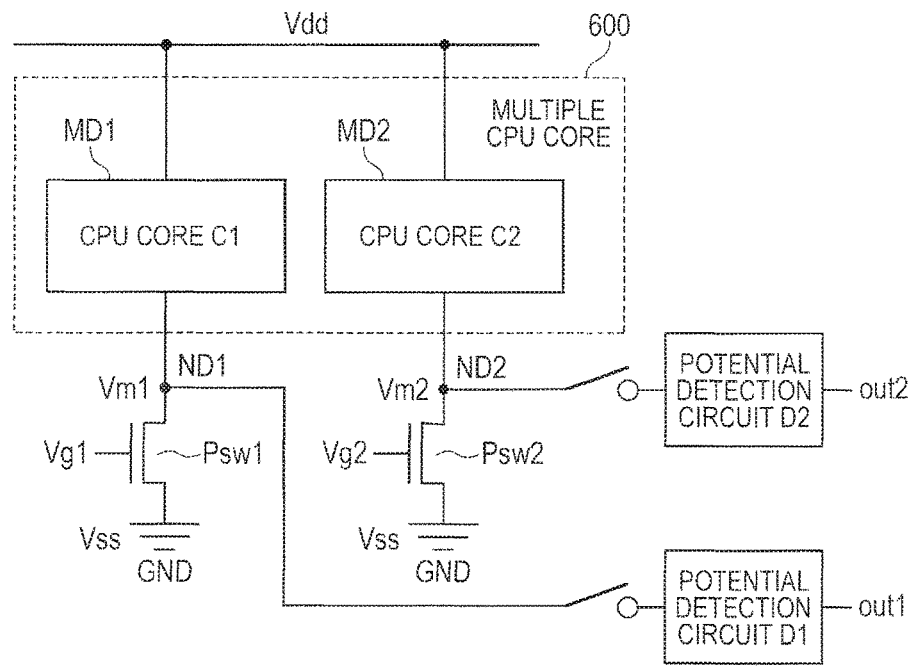
FIG. 19 is a diagram illustrating one example of a combination of the functional module MD1 with the functional module MD2 that is used for deciding whether the abnormal leakage current is present in a ninth embodiment.

FIG. 19 is a diagram illustrating one example of a combination of the functional module MD1 and the functional module MD2 that are used for deciding whether the abnormal leakage current is present in the ninth embodiment.

In the ninth embodiment, it is assumed that the CPU core C1 and the CPU core C2 that configure a multiple CPU core 600 respectively correspond to the functional module MD1 and the functional module MD2 described in the second embodiment.

The configurations of the CPU core C1 and the CPU core C2 are the same as or similar to each other. That is, the number of gates included in the CPU core C1 and the number of gates included in the CPU core C2 are the same as or similar to each other. In addition, the ratio among the transistors HVT, SVT and LVT included in the CPU core C1 is the same as or similar to the ratio among the transistors HVT, SVT and LVT included in the CPU core C2. Accordingly, the ratio between the leakage current that flows out of the CPU core C1 and the leakage current that flows out of the CPU core C2 has no temperature dependency.

Similarly to the configuration according to the second embodiment, the potential detection circuit D1 detects the pseudo ground potential Vm1 at the node ND1 and the potential detection circuit D2 detects the pseudo ground potential Vm2 at the node ND2. Similarly to the configuration according to the second embodiment, generation of the abnormal leakage current is decided by the abnormal leakage detection unit 150 in accordance with a time-dependent change in the pseudo ground potentials Vm1 and Vm2.

According to the ninth embodiment, it is possible to detect the abnormal leakage current with high accuracy. In addition, since the CPU core C1 and the CPU core C2 are the same as or similar to each other in the number of gates and the ratio among the transistors HVT, SVT and LVT, the expected value of the time ratio t1/t2 taken until the pseudo ground potentials Vm1 and Vm2 reach the threshold voltage Vcrit is "1". Accordingly, it is possible to save time and labor used for measuring the expected value in the test before shipment and storing the expected value in the semiconductor device in advance.

Tenth Embodiment

It is assumed that the semiconductor device according to the tenth embodiment includes the transistors SVT, HVT and LVT.

It is assumed that the functional modules MD1 and MD2 satisfy the following condition B. It is assumed that the number of gates included in the functional module MD1 is 2M gates. It is assumed that the transistors included in the functional modules MD1 are the transistors SVT. It is assumed that the number of gates included in the functional module MD2 is 1M gates. It is assumed that 80% of the transistors included in the functional module MD2 are the transistors LVT. It is assumed that 20% of the transistors included in the functional module MD2 are the transistors SVT.

Figure 20:
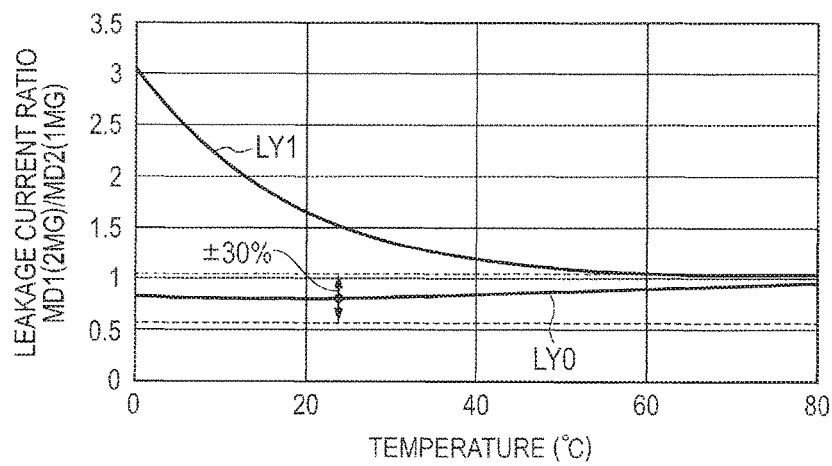
FIG. 20 is a graph illustrating one example of a leakage current ratio between the functional module MD1 and the functional module MD2 when the functional module MD1 and the functional module MD2 satisfy a condition B.

FIG. 20 is a graph illustrating one example of a leakage current ratio between the functional module MD1 and the functional module MD2 when the functional modules MD1 and MD2 satisfy the condition B.

The temperature dependency of a leakage current ratio LY0 obtained in the state where there is no destruction of the gate insulating film is small. This is because the temperature dependency of the leakage current of the transistor LVT is similar to the temperature dependency of the leakage current of the transistor SVT.

Accordingly, in the tenth embodiment, two functional modules that include only SVT or LVT as the transistors are selected and the leakage current ratio between the selected functional modules is obtained.

Figure 21:
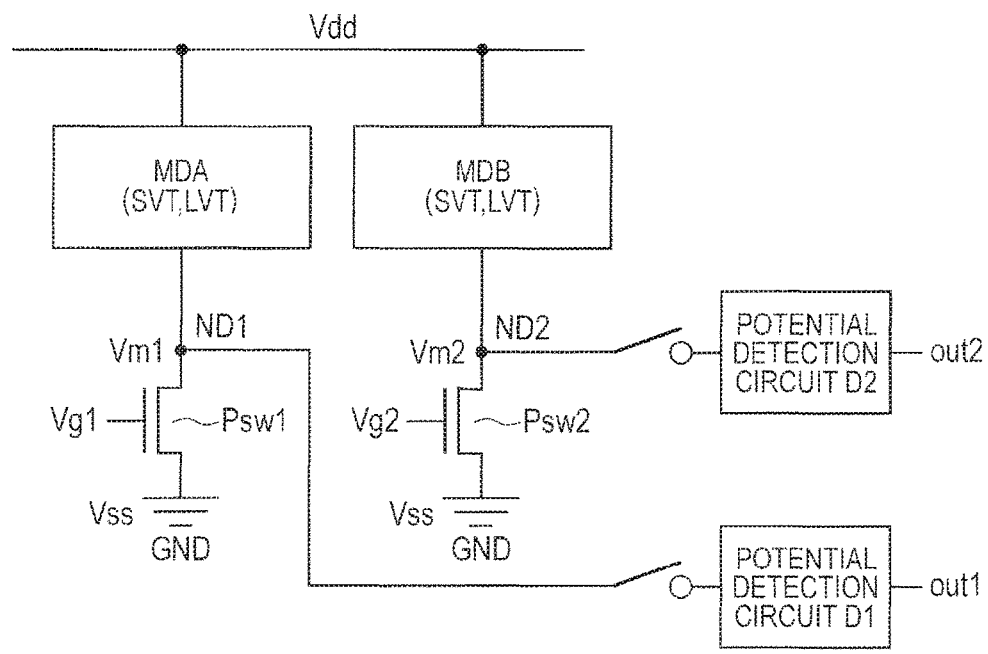
FIG. 21 is a diagram illustrating one example of a combination of the functional module MD1 with the functional module MD2 that is used for deciding whether the abnormal leakage current is present in a tenth embodiment.

FIG. 21 is a diagram illustrating one example of a combination of the functional module MD1 and the functional module MD2 that are used for deciding whether the abnormal leakage current is present in the tenth embodiment.

In the tenth embodiment, it is assumed that functional modules MDA and MDB that include only SVT and LVT as the transistors respectively correspond to the functional module MD1 and the functional module MD2 described in the second embodiment.

Similarly to the configuration according to the second embodiment, the potential detection circuit D1 detects the pseudo ground potential Vm1 at the node ND1 and the potential detection circuit D2 detects the pseudo ground potential Vm2 at the node ND2. Similarly to the configuration according to the second embodiment, generation of the abnormal leakage current is detected by the abnormal leakage detection unit 150 in accordance with the time-dependent change in the pseudo ground potentials Vm1 and Vm2.

As described above, according to the tenth embodiment, it is possible to detect the abnormal leakage current with high accuracy similarly to the ninth embodiment. Incidentally, as described also in the second embodiment, a leakage current ratio LY1 obtained in a state where destruction of the gate insulating film has been generated is away from the normal leakage current ratio LY0 with decreasing the temperature and approaches the normal leakage current ratio LY0 with increasing the temperature. This is because the normal leakage current is increased at a high temperature in comparison with the current of, for example, about 0.2 mA that has been added due to destruction of the gate insulating film.

Altered Example of Tenth Embodiment

Since the characteristic of the leakage current from the transistor HVT is different from the characteristics of the leakage currents from the transistors SVT and LVT and the characteristic of the leakage current from the transistor SVT is similar to the characteristic of the leakage current from the transistor LVT, it is possible to detect the abnormal leakage current with high accuracy also by measuring a leakage current ratio between two functional modules that are the same as or similar to each other in the ratio of the transistors HVT and the ratio that the transistors SVT and LVT are mutually combined.

Eleventh Embodiment

It is possible to apply the first to tenth embodiments not only to detection of the fault in the functional module but also to fault prediction.

It is known that the leakage current is gradually increased also before the gate insulating film is destroyed (see, for example, Reference Document A).

Figure 22:
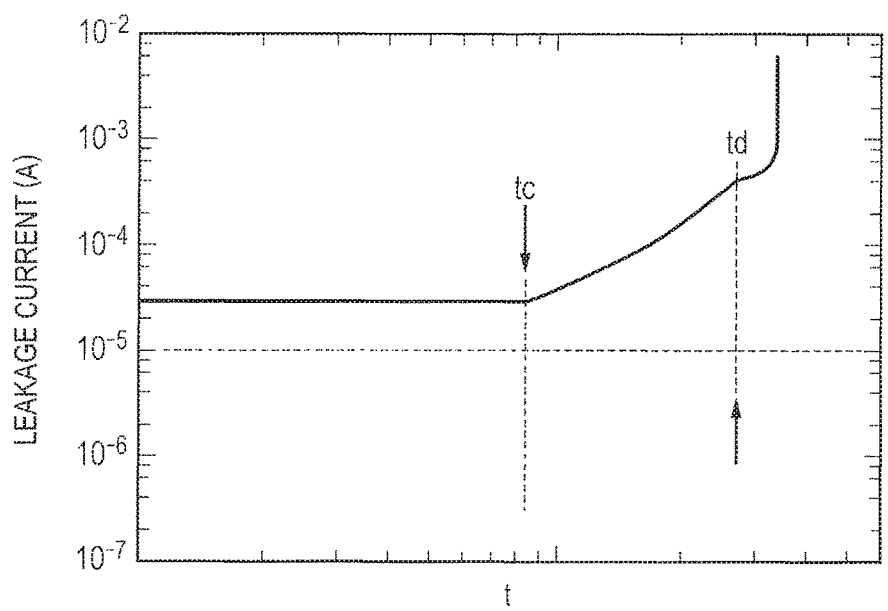
FIG. 22 is a graph illustrating one example of a time-dependent change in leakage current that leads to destruction of a gate insulating film.

FIG. 22 is a diagram illustrating one example of a time-dependent change in leakage current that leads to destruction of the gate insulating film described in Reference Document A (IEEE Transaction on Electron Devices, vol. 53, No. 2, February 2006, pp. 224-234).

In FIG. 22, the gate insulating film is destroyed at a time td. When the gate insulating film is destroyed, pin-hole current of about 1 mA is observed at a normal voltage on a destroyed part. However, the leakage current is gradually increased also at a time tc and successive times before the time td. In the example in FIG. 22, it is possible to detect the abnormal leakage current of, for example, about 10 µA in the following manner.

FIG. 23 is a flowchart illustrating one example of a procedure of deciding whether the abnormal leakage current has been generated in the configuration according to the eleventh embodiment.

Since step S101 to step S108 are the same as those in FIG. 8, description thereon is not repeated.

In step S209, when THR2>(R12N−R12)/R12≥THR1 (S209: YES), the process proceeds to step S210 and when (R12N−R12)/R12≥THR2 or (R12N−R12)/R12<THR1 (S209: NO), the process proceeds to step S211.

In step S211, when THR2>(R12−R12N)/R12≥THR1 (S211: YES), the process proceeds to step S212 and when (R12−R12N)/R12≥THR2 or (R12−R12N)/R12<THR1 (S211: NO), the process proceeds to step S213.

In step S213, when (R12N−R12)/R12≥THR2 (S213: YES), the process proceeds to step S214 and when (R12N−R12)/R12<THR2 (S213: NO), the process proceeds to step S215.

In step S215, when (R12−R12N)/R12≥THR2 (S215: YES), the process proceeds to step S216.

In step 210, the decision unit 114 decides that at least one of the elements included in the functional module MD1 is in a state of being destroyed shortly.

In step S212, the decision unit 114 decides that at least one of the elements included in the functional module MD2 is in the state of being destroyed shortly.

In step S214, the decision unit 114 decides that at least one of the elements included in the functional module MD1 is in an already destroyed state.

In step S216, the decision unit 114 decides that at least one of the elements included in the functional module MD2 is in the already destroyed state.

As described above, in the eleventh embodiment, it is possible to detect not only the destroyed state of one of the elements that configure the functional module concerned but also the state of being destroyed shortly of one of the elements that configure the functional module concerned.

Incidentally, although in the description on the above-mentioned first to eleventh embodiments, a case where the abnormal leakage current is generated due to destruction of the gate insulating film has been described, it goes without saying that it is possible to detect a local fault by the embodiments of the present invention also for the abnormal leakage current that is generated due to other causes such as, for example, a gate-to-contact short-circuit, destruction of an interlayer film between wirings and so forth.

Although in the foregoing, the invention that has been made by the inventors and others has been specifically described on the basis of the preferred embodiments of the present invention, it goes without saying that the present invention is not limited to the above-mentioned embodiments and may be altered and modified in a variety of ways within the range not deviating from the gist of the present invention.

What is claimed is:

1. A semiconductor device comprising:
a first functional module;
a second functional module;
a first power switch that controls coupling between the first functional module and a fixed potential node;
a second power switch that controls coupling between the second functional module and the fixed potential node; and
an abnormality monitor unit that detects whether abnormal leakage current has been generated from the first functional module or the second functional module on the basis of a comparison between a change in voltage at a first node between the first functional module and the first power switch when the first power switch is in an off state and a change in voltage at a second node between the second functional module and the second power switch when the second power switch is in the off state.

2. The semiconductor device according to claim 1, wherein the abnormality monitor unit includes
a first potential detection circuit that detects the change in voltage at the first node when the first power switch is in the off state,
a second potential detection circuit that detects the change in voltage at the second node when the second power switch is in the off state, and
an abnormal leakage detection unit that detects whether the abnormal leakage current has been generated from the first functional module or the second functional module on the basis of a comparison between a change velocity of a potential at the first node and a change velocity of a potential at the second node.

3. The semiconductor device according to claim 2, wherein the abnormal leakage detection unit calculates a ratio between a first time taken until the potential at the first node shifts to a predetermined potential and a second time taken until the potential at the second node shifts to the predetermined potential as a measured value and detects whether the abnormal leakage current has been generated on the basis of a comparison between the measured value and an expected value.

4. The semiconductor device according to claim 3, wherein the abnormality monitor unit further includes
a timer, and
a control circuit that controls the first power switch and the second power switch,
wherein the abnormal leakage detection unit
acquires the first time by making the timer start at a timing that the control circuit has turned the first power switch off and making the timer terminate at a timing that the potential at the first node has reached the predetermined potential, and
acquires the second time by making the timer start at a timing that the control circuit has turned the second power switch off and making the timer terminate at a timing that the potential at the second node has reached the predetermined potential.

5. The semiconductor device according to claim 3, further comprising:
a storage unit that stores the acquired first time and the acquired second time,
wherein the storage unit is arranged in a region to which a power source voltage is always supplied.

6. The semiconductor device according to claim 3, further comprising:
a nonvolatile memory that stores the acquired first time and the acquired second time.

7. The semiconductor device according to claim 3,
wherein the abnormal leakage detection unit includes
a nonvolatile memory that stores the expected value obtained by a test performed before shipment.

8. The semiconductor device according to claim 3,
wherein the abnormal leakage detection unit includes
a CPU that calculates the ratio between the first time and the second time as the measured value and compares the measured value with the expected value,
wherein the CPU is arranged outside a region to which a power source voltage is always supplied.

9. The semiconductor device according to claim 2,
wherein the abnormal leakage detection unit includes
a first counter that counts a first time taken until the potential at the first node shifts to a predetermined potential,
a second counter that counts a second time taken until the potential at the second node shifts to the predetermined potential, and
a comparative decision circuit that decides whether the abnormal leakage current has been generated by comparing a value of the first counter with a value of the second counter.

10. The semiconductor device according to claim 9,
wherein the abnormality monitor unit includes
a timer, and
a control circuit that controls the first power switch and the second power switch,
wherein the first counter and the second counter each counts the number of pulses of a clock signal received,
wherein the first counter starts counting when receiving a first start signal that is transmitted from the control circuit at a timing that the control circuit has turned the first power switch off, and terminates the counting when receiving a first termination signal that is transmitted from the first potential detection circuit at a timing that the potential at the first node has reached the predetermined potential, and
wherein the second counter starts the counting when receiving a second start signal that is transmitted from the control circuit at a timing that the control circuit has turned the second power switch off and terminates the counting when receiving a second termination signal that is transmitted from the second potential detection circuit at a timing that the potential at the second node has reached the predetermined potential.

11. The semiconductor device according to claim 1,
wherein the first functional module and the second functional module are respectively a first CPU core and a second CPU core that configure multiple CPU cores.

12. The semiconductor device according to claim 1, further comprising:
a first-kind transistor that has a first threshold value;
a second-kind transistor that has a second threshold value that is larger than the first threshold value; and
a third-kind transistor that has a third threshold value that is smaller than the first threshold value,
wherein all transistors that configure the first functional module and the second functional module are the first-kind transistor or the third-kind transistor.

13. The semiconductor device according to claim 1,
wherein the fixed potential node is a node to be coupled with a ground power source.

14. The semiconductor device according to claim 1,
wherein the fixed potential node is a node to which a power source voltage is supplied.

15. A semiconductor device comprising:
a first functional module;
a second functional module;
a first power switch that controls coupling between the first functional module and a fixed potential node;
a second power switch that controls coupling between the second functional module and the fixed potential node; and
an abnormality monitor unit that detects a change in voltage at a first node between the first functional module and the first power switch when the first power switch is in an off state, detects a change in voltage at a second node between the second functional module and the second power switch when the second power switch is in the off state, calculates a ratio between a first time taken until the potential at the first node shifts to a predetermined potential and a second time taken until the potential at the second node shifts to the predetermined potential as a measured value, and decides that an element included in the first functional module or the second functional module will be in a malfunction state shortly or that the element included in the first functional module or the second functional module is in a malfunction state on the basis of a comparison between the measured value and an expected value.

* * * * *